United States Patent
Otsuka

(10) Patent No.: US 12,198,963 B2
(45) Date of Patent: *Jan. 14, 2025

(54) BONDING SYSTEM

(71) Applicant: Tokyo Electron Limited, Tokyo (JP)

(72) Inventor: Yoshitaka Otsuka, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/480,745

(22) Filed: Oct. 4, 2023

(65) Prior Publication Data

US 2024/0047257 A1 Feb. 8, 2024

Related U.S. Application Data

(63) Continuation of application No. 16/964,070, filed as application No. PCT/JP2019/000637 on Jan. 11, 2019, now Pat. No. 11,817,338.

(30) Foreign Application Priority Data

Jan. 23, 2018 (JP) ................................ 2018-008892

(51) Int. Cl.
*H01L 21/68* (2006.01)
*H01L 21/67* (2006.01)
(Continued)

(52) U.S. Cl.
CPC ...... *H01L 21/681* (2013.01); *H01L 21/67092* (2013.01); *H01L 21/67103* (2013.01);
(Continued)

(58) Field of Classification Search
CPC .................................................. H01L 21/00
See application file for complete search history.

(56) References Cited

U.S. PATENT DOCUMENTS 9,466,538 B1 10/2016 Skordas et al.
11,817,338 B2 * 11/2023 Otsuka .................... H01L 24/80
(Continued)

FOREIGN PATENT DOCUMENTS

CN 104658950 A 5/2015
JP 2007-158200 A 6/2007
(Continued)

OTHER PUBLICATIONS

International Search Report for PCT/JP2019/000637, dated Feb. 26, 2019.

*Primary Examiner* — Jeffry H Aftergut
(74) *Attorney, Agent, or Firm* — Pearne & Gordon LLP

(57) ABSTRACT

A bonding system includes a first holder and a second holder arranged to be spaced apart from each other in a vertical direction; a position adjuster configured to move the first holder and the second holder relatively to perform a position adjustment in a horizontal direction between a first substrate held by the first holder and a second substrate held by the second holder; a pressing unit configured to press the first substrate and the second substrate against each other; a measuring unit configured to measure a position deviation between an alignment mark on the first substrate and an alignment mark on the second substrate, the first substrate and the second substrate being bonded by the pressing unit; and a position adjustment controller configured to control the position adjustment in the horizontal direction in a currently-performed bonding processing based on the position deviation generated in a previously-performed bonding processing.

20 Claims, 16 Drawing Sheets

(51) Int. Cl.
*H01L 21/683* (2006.01)
*H01L 23/00* (2006.01)

(52) U.S. Cl.
CPC .... *H01L 21/67259* (2013.01); *H01L 21/6838* (2013.01); *H01L 24/80* (2013.01); *H01L 2224/80011* (2013.01); *H01L 2224/8013* (2013.01); *H01L 2224/80896* (2013.01)

(56) References Cited

U.S. PATENT DOCUMENTS

| | | |
|---|---|---|
| 2014/0208556 A1 | 7/2014 | Sugihara et al. |
| 2014/0349465 A1 | 11/2014 | Yamamoto et al. |
| 2015/0017782 A1 | 1/2015 | Akiyama et al. |
| 2015/0044786 A1 | 2/2015 | Huang et al. |
| 2015/0129137 A1 | 5/2015 | Sugihara et al. |
| 2018/0019225 A1 | 1/2018 | Matsunaga et al. |

FOREIGN PATENT DOCUMENTS

| | | |
|---|---|---|
| JP | 2011-216833 A | 10/2011 |
| JP | 2015-018920 A | 1/2015 |
| JP | 2015-038982 A | 2/2015 |
| JP | 2015-095579 A | 5/2015 |
| KR | 10-2015-0007215 A | 1/2015 |
| TW | 201517207 A | 5/2015 |
| WO | 2017/155002 A1 | 9/2017 |

\* cited by examiner

BONDING SYSTEM

CROSS-REFERENCE TO RELATED APPLICATION

This is a continuation application of U.S. patent application Ser. No. 16/964,070, filed on Jul. 22, 2020, which claims the benefit of Japanese Patent Application No. 2018-008892 filed on Jan. 23, 2018, the entire disclosures of which are incorporated herein by reference.

TECHNICAL FIELD

The various aspects and embodiments described herein pertain generally to a bonding system and a bonding method.

BACKGROUND

A bonding apparatus described in Patent Document 1 is equipped with an upper chuck configured to attract a substrate at an upper side from above it and a lower chuck configured to attract a substrate at a lower side from below it. While being held to face each other, the two substrates are bonded. To elaborate, the bonding apparatus brings a central portion of the upper substrate attracted by the upper chuck into contact with a central portion of the lower substrate attracted by the lower chuck by pressing down the central portion of the upper substrate. Accordingly, the central portions of the two substrates are bonded by an intermolecular force or the like. Then, the bonding apparatus expands a bonding region between the two substrates from the central portions of the substrates to peripheral portions thereof.

The bonding apparatus includes an upper imaging device fixed to the upper chuck; a lower imaging device fixed to the lower chuck; and a moving device configured to move the upper chuck and the lower chuck relatively. The upper imaging device is configured to image an alignment mark formed on the lower substrate which is attracted to the lower chuck. Meanwhile, the lower imaging device is configured to image an alignment mark formed on the upper substrate which is attracted to the upper chuck.

The bonding apparatus measures relative horizontal positions of the upper substrate and the lower substrate based on the images obtained by the upper imaging device and the lower imaging device. The bonding apparatus moves the upper chuck and the lower chuck relatively so that the alignment mark of the upper substrate and the alignment mark of the lower substrate are overlapped when viewed in the vertical direction. Then, the bonding apparatus bonds the upper substrate and the lower substrate.

PRIOR ART DOCUMENT

Patent Document 1: Japanese Patent Laid-open Publication No. 2015-095579

SUMMARY

In an exemplary embodiment, a bonding system includes a first holder and a second holder arranged to be spaced apart from each other in a vertical direction, the first holder having, on a surface thereof facing the second holder, an attraction surface configured to attract and hold a first substrate, and the second holder having, on a surface thereof facing the first holder, an attraction surface configured to attract and hold a second substrate; a position adjuster configured to move the first holder and the second holder relatively to perform a position adjustment in a horizontal direction between the first substrate held by the first holder and the second substrate held by the second holder; a pressing unit configured to press the first substrate held by the first holder and the second substrate held by the second holder against each other; a measuring unit configured to measure a position deviation between an alignment mark formed on the first substrate and an alignment mark formed on the second substrate, the first substrate and the second substrate being bonded by the pressing unit; and a position adjustment controller configured to control the position adjustment in the horizontal direction in a currently-performed bonding processing based on the position deviation generated in a previously-performed bonding processing.

According to the exemplary embodiments, it is possible to improve accuracy of position adjustment between a substrate at an upper side and a substrate at a lower side in the horizontal direction, which is performed before bonding of the two substrates is carried out.

DETAILED DESCRIPTION

Figure 1:
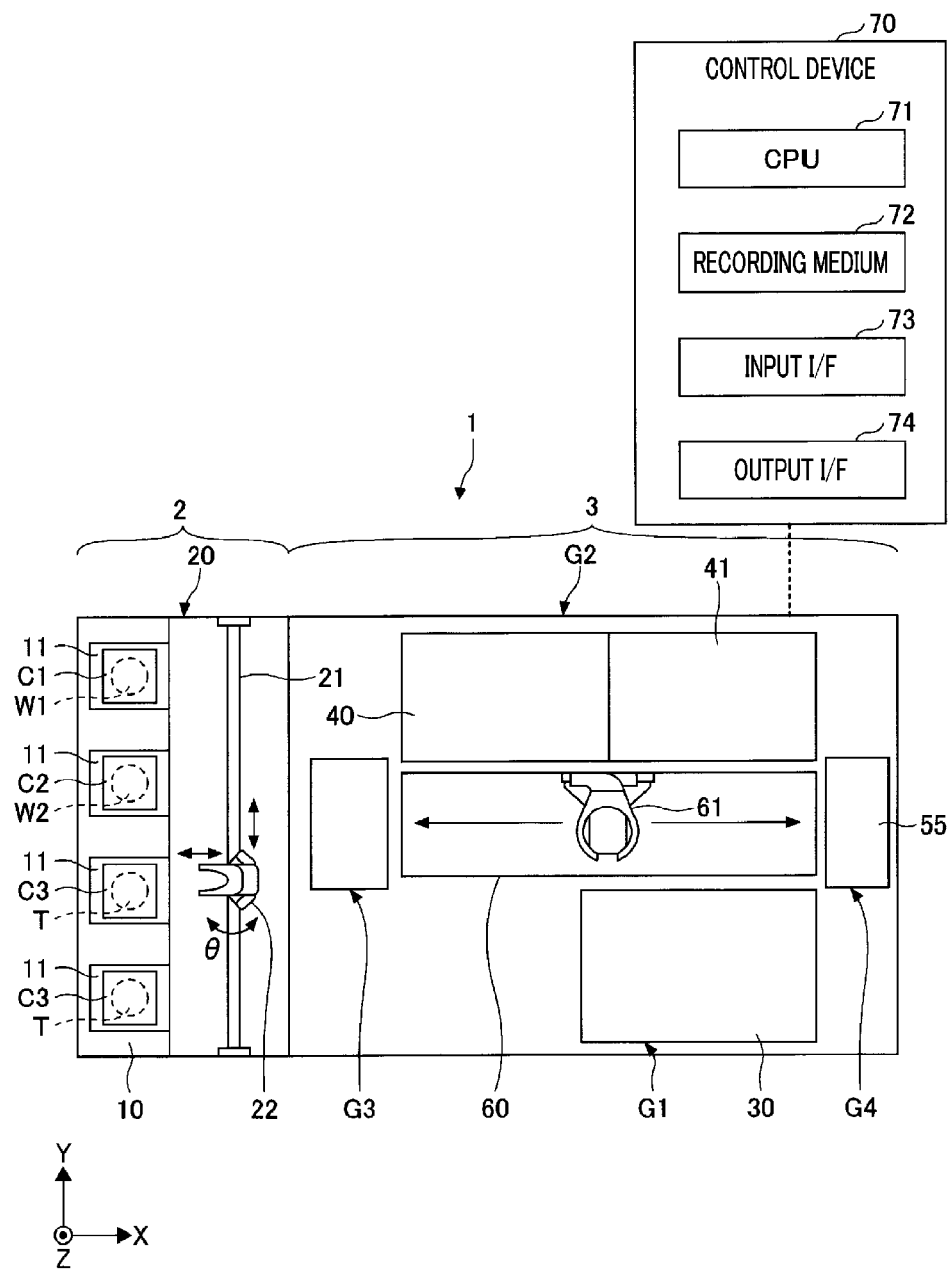
FIG. 1 is a plan view illustrating a bonding system according to an exemplary embodiment.

Hereinafter, exemplary embodiments of the present disclosure will be described in detail with reference to the accompanying drawings. In the various drawings, same or corresponding parts will be assigned same reference numerals, and redundant description may be omitted. In the following description, the X-axis direction, the Y-axis direction and the Z-axis direction are orthogonal to each other, and the X-axis and Y-axis directions are horizontal directions whereas the Z-axis direction is a vertical direction. A rotational direction around a vertical axis is also referred to as "θ direction." In the present specification, below means vertically below, and above means vertically above.

<Bonding System>

Figure 2:
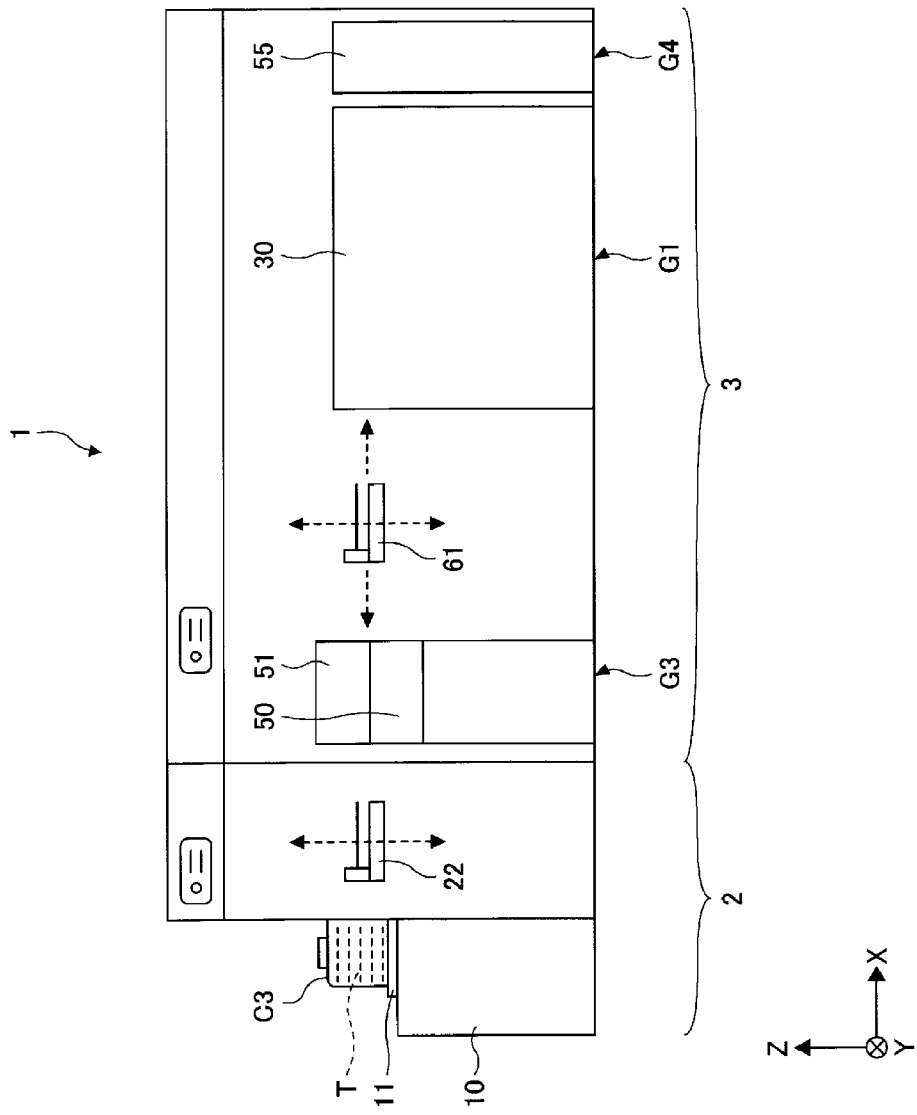
FIG. 2 is a side view illustrating the bonding system according to the exemplary embodiment.
Figure 3:
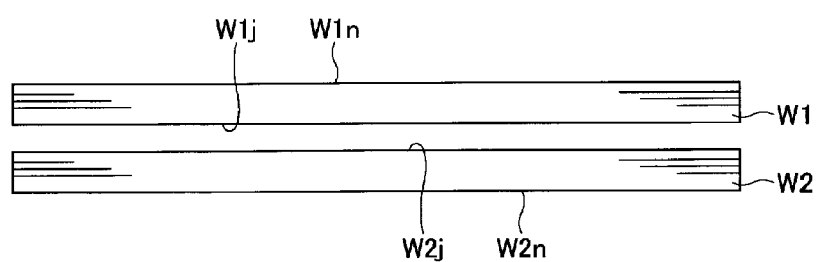
FIG. 3 is a side view illustrating a state before a first substrate and a second substrate are bonded according to the exemplary embodiment.

FIG. 1 is a plan view illustrating a bonding system 1 according to an exemplary embodiment. FIG. 2 is a side view illustrating the bonding system 1 according to the exemplary embodiment. FIG. 3 is a side view illustrating a state before a first substrate and a second substrate are bonded according to the exemplary embodiment. The bonding system 1 shown in FIG. 1 forms a combined substrate T (see FIG. 7B) by bonding a first substrate W1 and a second substrate W2.

The first substrate W1 is, for example, a semiconductor substrate such as a silicon wafer or a compound semiconductor wafer on which multiple electronic circuits are formed. The second substrate W2 is, for example, a bare wafer on which no electronic circuit is formed. The first substrate W1 and the second substrate W2 have the substantially same diameter. Further, the second substrate W2 may have an electronic circuit formed thereon.

In the following description, the first substrate W1 may sometimes be referred to as "upper wafer W1"; the second substrate W2, "lower wafer W2"; and the combined substrate T, "combined wafer T." Further, in the following description, as depicted in FIG. 3, among surfaces of the upper wafer W1, a surface to be bonded to the lower wafer W2 will be referred to as "bonding surface W1j", and a surface opposite to the bonding surface W1j will be referred to as "non-bonding surface W1n". Further, among surfaces of the lower wafer W2, a surface to be bonded to the upper wafer W1 will be referred to as "bonding surface W2j", and a surface opposite to the bonding surface W2j will be referred to as "non-bonding surface W2n."

As depicted in FIG. 1, the bonding system 1 includes a carry-in/out station 2 and a processing station 3. The carry-in/out station 2 and the processing station 3 are arranged in this sequence along the positive X-axis direction. Further, the carry-in/out station 2 and the processing station 3 are connected as a single body.

The carry-in/out station 2 includes a placing table 10 and a transfer section 20. The placing table 10 is equipped with a multiple number of placing plates 11. Provided on the placing plates 11 are cassettes C1, C2 and C3 each of which accommodates therein a plurality of (e.g., 25 sheets of) substrates horizontally. For example, the cassette C1 accommodates therein upper wafers W1; the cassette C2, lower wafers W2; and the cassettes C3, combined wafers T.

The transfer section 20 is provided adjacent to the positive X-axis side of the placing table 10. Provided in the transfer section 20 are a transfer path 21 extending in the Y-axis direction and a transfer device 22 configured to be movable along the transfer path 21. The transfer device 22 is configured to be movable in the X-axis direction as well as in the Y-axis direction and pivotable around the Z-axis. Further, the transfer device 22 is also configured to transfer the upper wafers W1, the lower wafers W2 and the combined wafers T between the cassettes C1 to C3 placed on the placing plates 11 and a third processing block G3 and the fourth processing block G4 of the processing station 3 to be described later.

Further, the number of the cassettes C1 to C3 placed on the placing plates 11 is not limited to the shown example. In addition, besides the cassettes C1 to C3, a cassette for collecting a problematic substrate or the like may be additionally provided on the placing plates 11.

A multiple number of, for example, four processing blocks G1, G2, G3 and G4 equipped with various kinds of devices are provided in the processing station 3. For example, the first processing block G1 is provided at a front side (negative Y-axis side of FIG. 1) of the processing station 3, and the second processing block G2 is provided at a rear side (positive Y-axis side of FIG. 1) of the processing station 3. Further, the third processing block G3 is provided at a side of the carry-in/out station 2 (negative X-axis side of FIG. 1) of the processing station 3. In the processing station 3, the fourth processing block G4 is provided at a side opposite to the carry-in/out station 2 (positive X-axis side of FIG. 1).

Provided in the first processing block G1 is a surface modifying apparatus 30 configured to modify the bonding surface W1j of the upper wafer W1 and the bonding surface W2j of the lower wafer W2. In the surface modifying apparatus 30, a $SiO_2$ bond on the bonding surfaces W1j and W2j of the upper wafer W1 and the lower wafer W2 is cut to be turned into SiO of a single bond, so that the bonding surfaces W1j and W2j are modified such that these surfaces are easily hydrophilized afterwards.

Furthermore, in the surface modifying apparatus 30, for example, an oxygen gas or a nitrogen gas as a processing gas is excited into plasma under a decompressed atmosphere to be ionized. As these oxygen ions or nitrogen ions are irradiated to the bonding surfaces W1j and W2j of the upper wafer W1 and the lower wafer W2, the bonding surfaces W1j and W2j are plasma-processed to be modified.

In the second processing block G2, a surface hydrophilizing apparatus 40 and a bonding apparatus 41 are disposed. The surface hydrophilizing apparatus 40 is configured to hydrophilize and clean the bonding surfaces W1j and W2j of the upper wafer W1 and the lower wafer W2 with, for example, pure water. In this surface hydrophilizing apparatus 40, while rotating the upper wafer W1 or the lower wafer W2 held by, for example, a spin chuck, the pure water is supplied onto the upper wafer W1 or the lower wafer W2. Accordingly, the pure water supplied onto the upper wafer W1 or the lower wafer W2 is diffused onto the bonding surface W1j of the upper wafer W1 or the bonding surface W2j of the lower wafer W2, so that the bonding surfaces W1j and W2j are hydrophilized.

The bonding apparatus 41 is configured to bond the upper wafer W1 and the lower wafer W2, which are hydrophilized, by an intermolecular force. A configuration of the bonding apparatus 41 will be discussed later.

In the third processing block G3, as shown in FIG. 2, transition (TRS) devices 50 and 51 for the upper wafer W1, the lower wafer W2 and the combined wafer T are provided in two levels in this order from below.

Provided in the fourth processing block G4 is an alignment measuring device 55. The alignment measuring device 55 is configured to measure a relative position deviation between the upper wafer W1 and the lower wafer W2 bonded by the bonding apparatus 41. The alignment measuring device 55 outputs measurement data to a control device 70 to be described later.

Further, the alignment measuring device 55 may be disposed at an outside of the processing station 3 as long as it is capable of transmitting the measurement data to the control device 70. By way of example, the combined wafer T may be carried out to the outside of the processing station 3 through the carry-in/out station 2 from the processing station 3, and then subjected to the measurement by the alignment measuring device 55.

Further, as illustrated in FIG. 1, a transfer section 60 is formed in a region surrounded by the first processing block G1, the second processing block G2, the third processing block G3 and the fourth processing block G4. A transfer device 61 is provided in the transfer section 60. The transfer device 61 is equipped with, for example, a transfer arm which is configured to be movable in a vertical direction and a horizontal direction and pivotable around a vertical axis. The transfer device 61 is moved within the transfer section 60 and transfers the upper wafers W1, the lower wafers W2 and the combined wafers T with respect to preset devices within the first processing block G1, the second processing block G2, the third processing block G3 and the fourth processing block G4 which are adjacent to the transfer section 60.

Furthermore, as depicted in FIG. 1, the bonding system 1 includes a control device 70. The control device 70 controls an operation of the bonding system 1. The control device 70 may be implemented by, for example, a computer and includes, as illustrated in FIG. 1, a CPU (Central Processing Unit) 71, a recording medium 72 such as a memory, an input interface 73 and an output interface 74. The control device 70 carries out various kinds of controls by allowing the CPU 71 to execute a program stored in the recording medium 72. Further, the control device 70 receives a signal from an outside through the input interface 73 and transmits a signal to the outside through the output interface 74.

The program of the control device 70 is recorded in an information recording medium and installed from the information recording medium. The information recording medium may be, by way of non-limiting example, a hard disc (HD), a flexible disc (FD), a compact disc (CD), a magnet optical disc (MO), or a memory card. Further, the program may be installed by being downloaded from a server through Internet.

<Bonding Apparatus>

Figure 4:
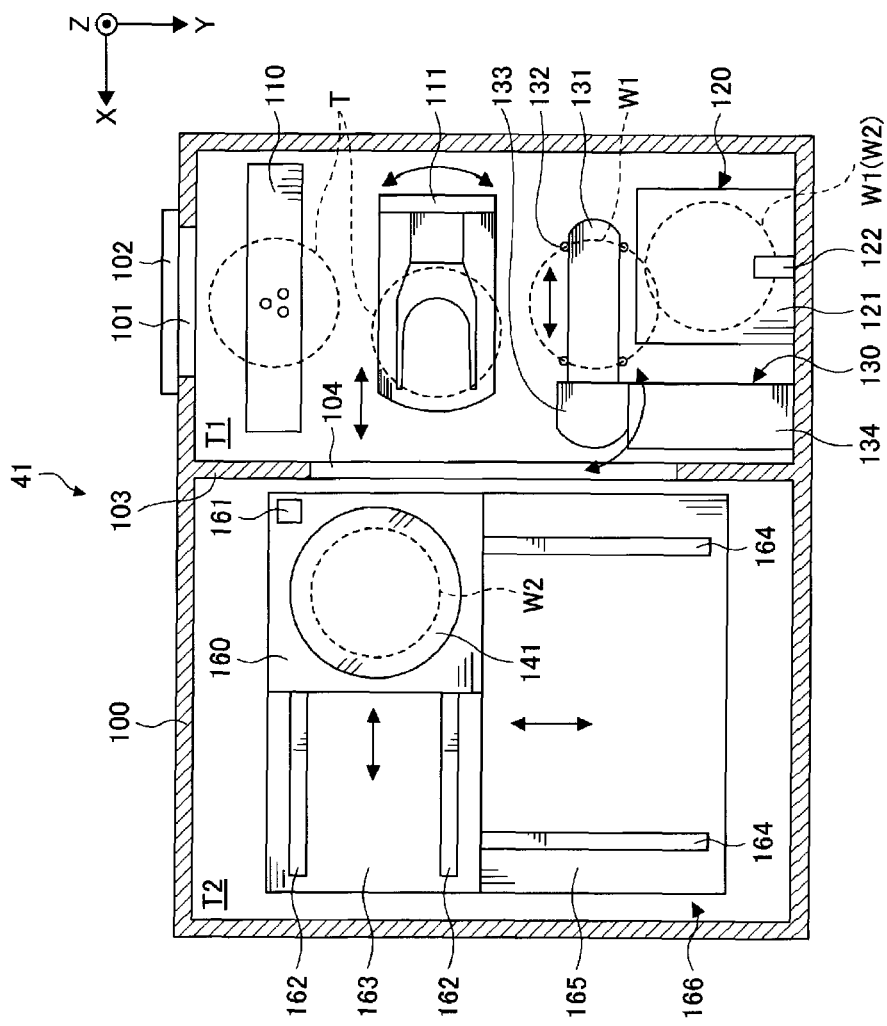
FIG. 4 is a plan view illustrating a bonding apparatus according to the exemplary embodiment.
Figure 5:
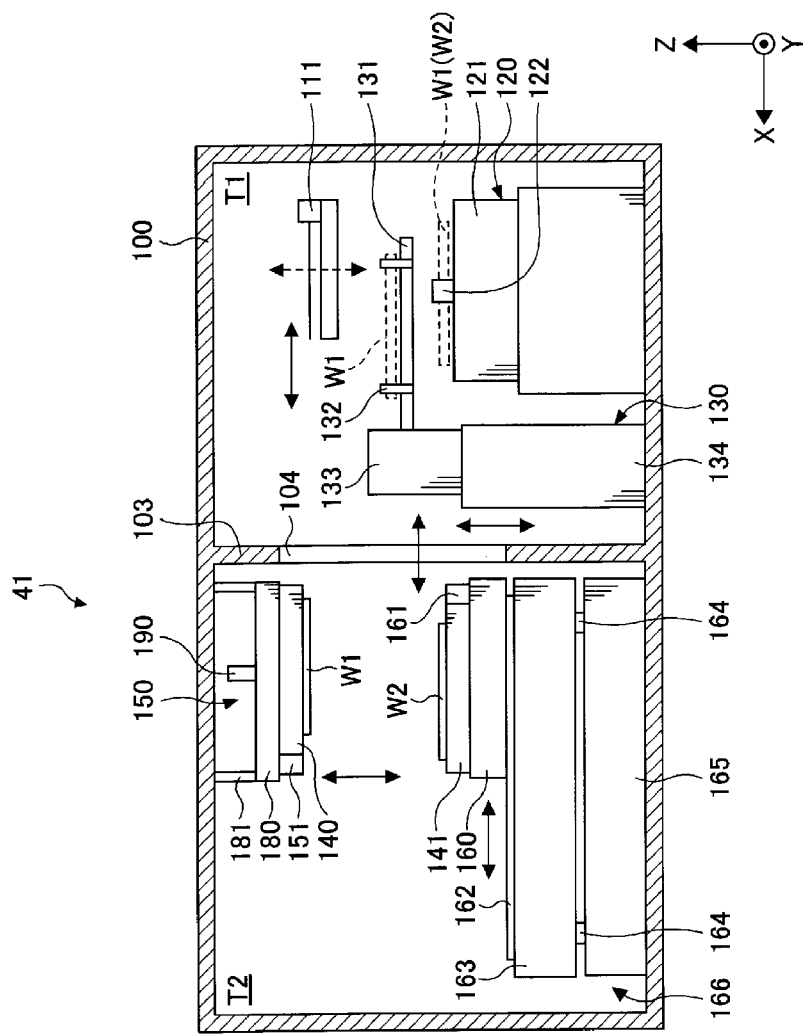
FIG. 5 is a side view illustrating the bonding apparatus according to the exemplary embodiment.

FIG. 4 is a plan view illustrating the bonding apparatus 41 according to the exemplary embodiment. FIG. 5 is a side view illustrating the bonding apparatus 41 according to the exemplary embodiment.

As depicted in FIG. 4, the bonding apparatus 41 includes a processing vessel 100 having a hermetically sealable inside. A carry-in/out opening 101 for the upper wafer W1, the lower wafer W2 and the combined wafer T is formed on a lateral side of the processing vessel 100 at a side of the transfer section 60. A shutter 102 for opening/closing the carry-in/out opening 101 is provided at the carry-in/out opening 101.

The inside of the processing vessel 100 is partitioned into a transfer region T1 and a processing region T2 by an inner wall 103. The aforementioned carry-in/out opening 101 is formed at a side surface of the processing vessel 100 in the transfer region T1. Further, a carry-in/out opening 104 for the upper wafer W1, the lower wafer W2 and the combined wafer T is formed at the inner wall 103.

In the transfer region T1, a transition 110, a wafer transfer device 111, an inverting device 130 and a position adjusting device 120 are arranged side by side in this sequence from, for example, a carry-in/out opening 101 side.

The transition 110 is configured to temporarily place thereon the upper wafer W1, the lower wafer W2 and the combined wafer T. The transition 110 has, for example, two levels, and is capable of holding any two of the upper wafer W1, the lower wafer W2 and the combined wafer T.

The wafer transfer device 111 is equipped with a transfer arm configured to be movable in the vertical direction (Z-axis direction) and the horizontal directions (Y-axis direction and X-axis direction) and also pivotable around a vertical axis, as shown in FIG. 4 and FIG. 5. The wafer transfer device 111 is capable of transferring the upper wafer W1, the lower wafer W2 and the combined wafer T within the transfer region T1 or between the transfer region T1 and the processing region T2.

The position adjusting device 120 is configured to adjust a direction of the upper wafer W1 (lower wafer W2) in the horizontal direction. To elaborate, the position adjusting device 120 includes a base 121 equipped with a non-illustrated holder configured to hold and rotate the upper wafer W1 (lower wafer W2); and a detector 122 configured to detect a position of a notch of the upper wafer W1 (lower wafer W2). The position adjusting device 120 adjusts the position of the notch of the upper wafer W1 (lower wafer W2) by detecting the position of the notch with the detector 122 while rotating the upper wafer W1 (lower wafer W2) held by the base 121. Accordingly, the position of the upper wafer W1 (lower wafer W2) in the horizontal direction is adjusted.

The inverting device 130 is configured to invert a front surface and a rear surface of the upper wafer W1. To elaborate, the inverting device 130 is equipped with a holding arm 131 configured to hold the upper wafer W1. The holding arm 131 extends in the horizontal direction (X-axis direction). Further, the holding arm 131 is provided with, at four positions, for example, holding members 132 configured to hold the upper wafer W1.

The holding arm 131 is supported by a driving unit 133 having, for example, a motor or the like. The holding arm 131 is configured to be rotatable around a horizontal axis by the driving unit 133. Further, the holding arm 131 is rotatable around the driving unit 133 and movable in the horizontal direction (X-axis direction). Another driving unit (not shown) including, for example, a motor or the like is provided under the driving unit 133. The driving unit 133 can be moved in the vertical direction along a vertically extending supporting column 134 by this another driving unit.

Further, the upper wafer W1 held by the holding members 132 can be rotated around the horizontal axis by the driving unit 133 and can also be moved in the vertical direction and the horizontal direction. Further, the upper wafer W1 held by the holding members 132 can be moved between the position adjusting device 120 and an upper chuck 140 to be described later by being rotated around the driving unit 133.

Provided within the processing region T2 are the upper chuck 140 configured to attract and hold a top surface (non-bonding surface W1n) of the upper wafer W1 from above and a lower chuck 141 configured to place thereon the lower wafer W and attract and hold a bottom surface (non-bonding surface W2n) of the lower wafer W2 from below. The lower chuck 141 is provided under the upper chuck 140 and configured to be arranged to face the upper chuck 140 in parallel. The upper chuck 140 and the lower chuck 141 are arranged apart from each other in the vertical direction.

As depicted in FIG. 5, the upper chuck 140 is held by an upper chuck holder 150 which is provided above the upper chuck 140. The upper chuck holder 150 is provided at a ceiling surface of the processing vessel 100. The upper chuck 140 is fixed to the processing vessel 100 with the upper chuck holder 150 therebetween.

The upper chuck holder 150 is equipped with an upper imaging device 151 configured to image a top surface (bonding surface W2j) of the lower wafer W2 held by the lower chuck 141. By way of example, a CCD camera is used as the upper imaging device 151.

The lower chuck 141 is supported by a first lower chuck mover 160 provided below the lower chuck 141. The first lower chuck mover 160 moves the lower chuck 141 in the horizontal direction (X-axis direction) as will be described later. Further, the first lower chuck mover 160 is also configured to be capable of moving the lower chuck 141 in the vertical direction and rotate the lower chuck 141 around a vertical axis.

The first lower chuck mover 160 is equipped with a lower imaging device 161 configured to image a bottom surface (bonding surface W1j) of the upper wafer W1 held by the upper chuck 140 (see FIG. 5). The lower imaging device 161 may be, by way of example, a CCD camera.

The first lower chuck mover 160 is fastened to a pair of rails 162 which is provided at a bottom side of the first lower chuck mover 160 and extends in the horizontal direction (X-axis direction). The first lower chuck mover 160 is configured to be movable along the rails 162.

The rails 162 are disposed on a second lower chuck mover 163. The second lower chuck mover 163 is fastened to a pair of rails 164 which is disposed at a bottom side of the second lower chuck mover 163 and extends in the horizontal direction (Y-axis direction). The second lower chuck mover 163 is configured to be movable in the horizontal direction (Y-axis direction) along the rails 164. Further, the rails 164 is disposed on the placing table 165 which is disposed at a bottom of the processing vessel 100.

The first lower chuck mover 160, the second lower chuck mover 163, and so forth constitute a position adjuster 166. The position adjuster 166 is configured to perform position adjustment in the horizontal direction between the upper wafer W1 held by the upper chuck 140 and the lower wafer W2 held by the lower chuck 141 by moving the lower chuck 141 in the X-axis direction, the Y-axis direction and the θ direction. Further, the position adjuster 166 is also configured to perform position adjustment in the vertical direction between the upper wafer W1 held by the upper chuck 140 and the lower wafer W2 held by the lower chuck 141 by moving the lower chuck 141 in the Z-axis direction.

Further, although the position adjuster 166 of the present exemplary embodiment carries out the position adjustment between the upper wafer W1 and the lower wafer W2 in the horizontal direction by moving the lower chuck 141 in the X-axis direction, the Y-axis direction and the θ direction, the present disclosure is not limited thereto. The way how the position adjuster 166 performs this position adjustment in the horizontal direction is not particularly limited as long as the upper chuck 140 and the lower chuck 141 are moved relatively to each other in the X-axis direction, the Y-axis direction and the θ direction. By way of example, the position adjuster 166 may perform the position adjustment in the horizontal direction between the upper wafer W1 and the lower wafer W2 by moving the lower chuck 141 in the X-axis direction and the Y-axis direction and by moving the upper chuck 140 in the θ direction.

Furthermore, although the position adjuster 166 of the present disclosure carries out the position adjustment between the upper wafer W1 and the lower wafer W2 in the vertical direction by moving the lower chuck 141 in the Z-axis direction, the present disclosure is not limited thereto. The way how the position adjuster 166 performs this position adjustment in the vertical direction is not particularly limited as long as the upper chuck 140 and the lower chuck 141 can be moved relatively to each other in the Z-axis direction. By way of example, the position adjuster 166 may perform the position adjustment between the upper wafer W1 and the lower wafer W2 in the vertical direction by moving the upper chuck 140 in the Z-axis direction.

Figure 6:
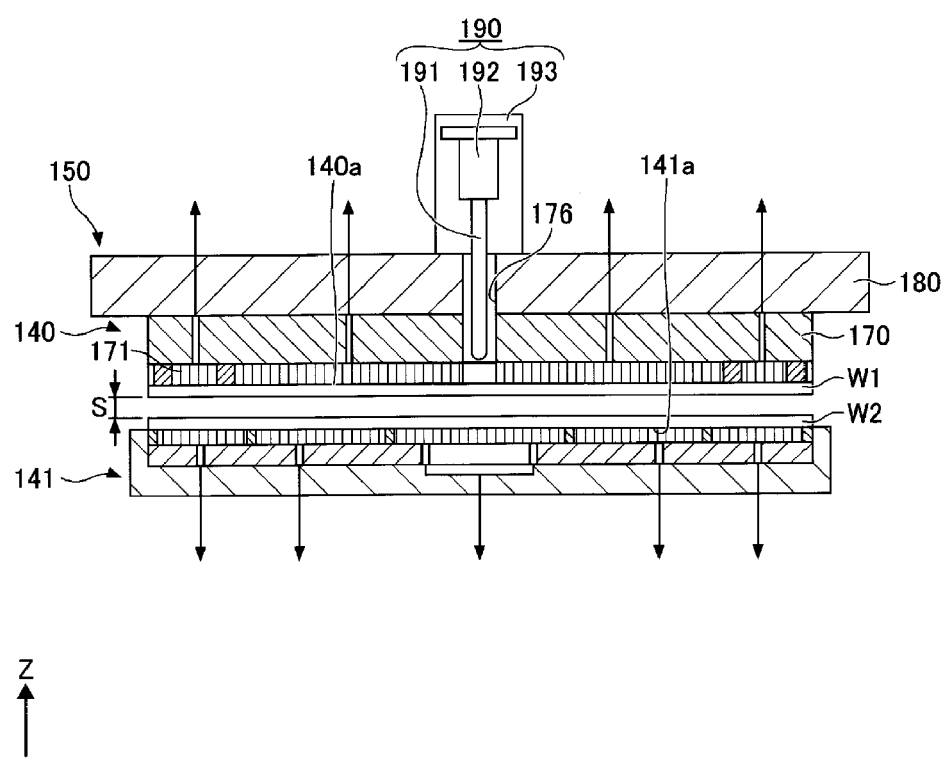
FIG. 6 is a cross sectional view illustrating an upper chuck and a lower chuck according to the exemplary embodiment, showing a state before an upper wafer and a lower wafer are bonded after their positions are adjusted.
Figure 7A:
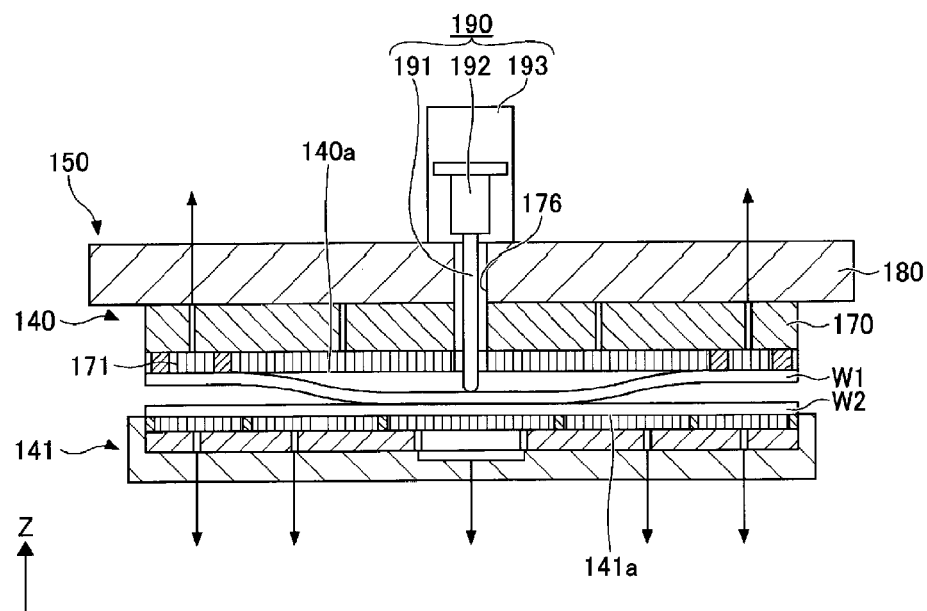
FIG. 7A and FIG. 7B are cross sectional views illustrating an operation through which the upper wafer and the lower wafer are gradually bonded from central portions toward peripheral portions thereof according to the exemplary embodiment.
Figure 7B:
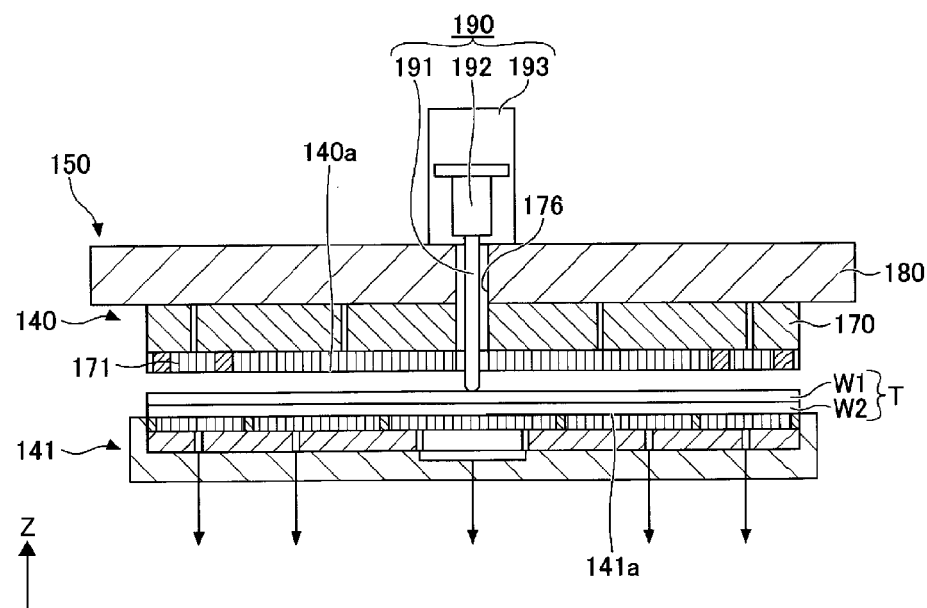

FIG. 6 is a cross sectional view illustrating the upper chuck and the lower chuck according to the exemplary embodiment, showing a state immediately before the upper wafer and the lower wafer are bonded. FIG. 7A is a cross sectional view illustrating a state in the middle of bonding between the upper wafer and the lower wafer according to the present exemplary embodiment. FIG. 7B is a cross sectional view illustrating a state upon the completion of the bonding between the upper wafer and the lower wafer according to the present exemplary embodiment. Solid-lined arrows in FIG. 6, FIG. 7A and FIG. 7B indicate a direction in which air is suctioned by a vacuum pump.

The upper chuck 140 and the lower chuck 141 are, for example, vacuum chucks. In the present exemplary embodiment, the upper chuck 140 corresponds to a first holder described in claims, and the lower chuck 141 corresponds to a second holder described in the claims. The upper chuck 140 has, at the surface (bottom surface) thereof facing the lower chuck 141, an attraction surface 140a to which the upper wafer W1 is attracted. Meanwhile, the lower chuck 141 has, at the surface (top surface) facing the upper chuck 140, an attraction surface 141a to which the lower wafer W2 is attracted.

The upper chuck 140 has a chuck base 170. The chuck base 170 has a diameter equal to or larger than a diameter of the upper wafer W1. The chuck base 170 is supported by a supporting member 180. The supporting member 180 is disposed to cover at least the chuck base 170 when viewed from the top, and is fixed to the chuck base 170 by, for example, screws. The supporting member 180 is supported by a plurality of supporting columns 181 (see FIG. 5) provided at the ceiling surface of the processing vessel 100. The supporting member 180 and the plurality of supporting columns 181 constitute the upper chuck holder 150.

A through hole 176 is formed through the supporting member 180 and the chuck base 170 in the vertical direction. A position of the through hole 176 corresponds to a central portion of the upper wafer W1 attracted to and held by the upper chuck 140. A push pin 191 of a striker 190 is inserted into this through hole 176.

The striker 190 is provided on a top surface of the supporting member 180 and is equipped with the push pin 191, an actuator unit 192 and a linearly moving mechanism 193. The push pin 191 is a columnar member extending along the vertical direction and is supported by an actuator unit 192.

The actuator unit 192 is configured to generate a constant pressure in a certain direction (here, a vertically downward direction) by air supplied from, for example, an electro-pneumatic regulator (not shown). By the air supplied from the electro-pneumatic regulator, the actuator unit 192 is capable of controlling a press load applied to the central portion of the upper wafer W1 as it is brought into contact with the central portion of the upper wafer W1. Further, a leading end of the push pin 191 is movable up and down in the vertical direction through the through hole 176 by the air from the electro-pneumatic regulator.

The actuator unit 192 is supported at the linearly moving mechanism 193. The linearly moving mechanism 193 moves the actuator unit 192 in the vertical direction by a driving unit including a motor, for example.

The striker 190 is configured as described above, and controls a movement of the actuator unit 192 by the linearly moving mechanism 193 and controls the press load upon the upper wafer W1 from the push pin 191 by the actuator unit 192.

The striker 190 presses the upper wafer W1 attracted to and held by the upper chuck 140 and the lower wafer W2 attracted to and held by the lower chuck 141 to allow the upper wafer W1 and the lower wafer W2 to come into contact with each other. To elaborate, the striker 190 transforms the upper wafer W1 attracted to and held by the upper chuck 140, thus allowing the upper wafer W1 to be pressed in contact with the lower wafer W2. The striker 190 corresponds to a pressing unit described in the claims.

A plurality of pins 171 is provided on a bottom surface of the chuck base 170, and these pins 171 are in contact with the non-bonding surface Win of the upper wafer W1. The upper chuck 140 is composed of the chuck base 170, the plurality of pins 171, and so forth. The attraction surface 140a of the upper chuck 140 which attracts and holds the upper wafer W1 is divided into multiple regions in a diametrical direction, and generation of an attracting pressure and release of the attracting pressure are performed for divided regions individually.

Further, the lower chuck 141 may be configured the same as the upper chuck 140. The lower chuck 141 has a plurality of pins in contact with the non-bonding surface W2n of the lower wafer W2. The attraction surface 141a of the lower chuck 141 which attracts and holds the lower wafer W2 is divided into multiple regions in the diametrical direction, and generation of an attracting pressure and release of the attracting pressure are performed for divided regions individually.

<Bonding Method>

Figure 8:
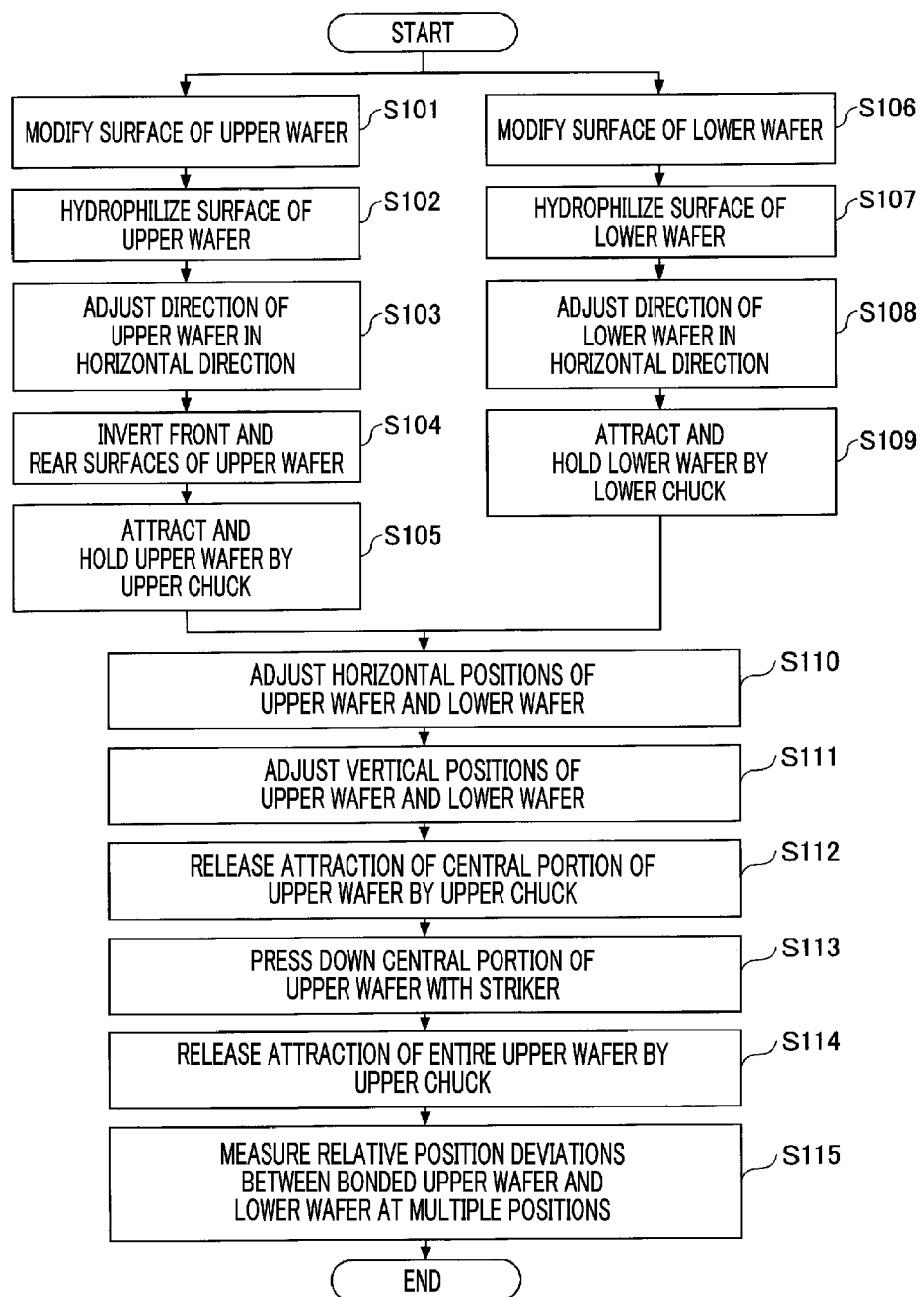
FIG. 8 is a flowchart illustrating a part of a processing performed by the bonding system according to the exemplary embodiment.

FIG. 8 is a flowchart illustrating a part of a processing performed by the bonding system according to the exemplary embodiment. Further, the various processes shown in FIG. 8 are performed under the control of the control device 70.

First, a cassette C1 accommodating a plurality of upper wafers W1, a cassette C2 accommodating a plurality of lower wafers W2 and an empty cassette C3 are placed on the preset placing plates 11 of the carry-in/out station 2. Then, an upper wafer W1 is taken out of the cassette C1 by the transfer device 22 and is transferred to the transition device 50 of the third processing block G3 of the processing station 3.

Subsequently, the upper wafer W1 is transferred into the surface modifying apparatus 30 of the first processing block G1 by the transfer device 61. In the surface modifying apparatus 30, an oxygen gas as the processing gas is formed into plasma to be ionized under the preset decompressed atmosphere. The oxygen ions are irradiated to the bonding surface W1j of the upper wafer W1, and the bonding surface W1j is plasma-processed. As a result, the bonding surface W1j of the upper wafer W1 is modified (process S101).

Then, the upper wafer W1 is transferred into the surface hydrophilizing apparatus 40 of the second processing block G2 by the transfer device 61. In the surface hydrophilizing apparatus 40, the pure water is supplied onto the upper wafer W1 while rotating the upper wafer W1 held by the spin chuck. The supplied pure water is diffused on the bonding surface W1j of the upper wafer W1, and hydroxyl groups (silanol groups) adhere to the bonding surface W1j of the upper wafer W1 modified in the surface modifying apparatus 30, so that the bonding surface W1j is hydrophilized (process S102). Further, the bonding surface W1j of the upper wafer W1 is cleaned by this pure water used to hydrophilize the bonding surface W1j.

Thereafter, the upper wafer W1 is transferred into the bonding apparatus 41 of the second processing block G2 by the transfer device 61. The upper wafer W1 transferred into the bonding apparatus 41 is then delivered into the position adjusting mechanism 120 via the transition 110 by the wafer transfer mechanism 111. Then, the direction of the upper wafer W1 in the horizontal direction is adjusted by the position adjusting mechanism 120 (process S103).

Subsequently, the upper wafer W1 is delivered from the position adjusting mechanism 120 onto the holding arm 131 of the inverting mechanism 130. Then, in the transfer region T1, by inverting the holding arm 131, the front surface and the rear surface of the upper wafer W1 are inverted (process S104). That is, the bonding surface Wij of the upper wafer W1 is turned to face down.

Afterwards, the holding arm 131 of the inverting mechanism 130 is rotated to be located under the upper chuck 140. Then, the upper wafer W1 is delivered to the upper chuck 140 from the inverting mechanism 130. The non-bonding surface Win of the upper wafer W1 is attracted to and held by the upper chuck 140 in the state that the notch of the upper wafer W1 is oriented to a predetermined direction (process S105).

While the above-described processes S101 to S105 are being performed on the upper wafer W1, a processing of the lower wafer W2 is performed. First, the lower wafer W2 is taken out of the cassette C2 by the transfer device 22 and transferred into the transition device 50 of the processing station 3 by the transfer device 22.

Thereafter, the lower wafer W2 is transferred into the surface modifying apparatus 30 by the transfer device 61, and the bonding surface W2j of the lower wafer W2 is modified (process S106). Further, the modification of the bonding surface W2j of the lower wafer W2 in the process S106 is the same as the above-stated process S101.

Then, the lower wafer W2 is transferred into the surface hydrophilizing apparatus 40 by the transfer device 61, and the bonding surface W2j of the lower wafer W2 is hydrophilized (process S107). Further, the bonding surface W2j is cleaned by the pure water used to hydrophilize the bonding surface W2j. The hydrophilizing of the bonding surface W2j of the lower wafer W2 in the process S107 is the same as the hydrophilizing of the bonding surface W1j of the upper wafer W1 in the above-described process S102.

Thereafter, the lower wafer W2 is transferred into the bonding apparatus 41 by the transfer device 61. The lower wafer W2 transferred into the bonding apparatus 41 is then sent into the position adjusting mechanism 120 via the transition 110 by the wafer transfer mechanism 111. Then, the direction of the lower wafer W2 in the horizontal direction is adjusted by the position adjusting mechanism 120 (process S108).

Afterwards, the lower wafer W2 is transferred onto the lower chuck 141 by the wafer transfer mechanism 111 and attracted to and held by the lower chuck 141 (process S109). At this time, the non-bonding surface W2n of the lower wafer W2 is attracted to and held by the lower chuck 141 in the state that the notch of the lower wafer W2 is oriented to the same direction as the notch of the upper wafer W1.

Thereafter, the position adjustment in the horizontal direction between the upper wafer W1 held by the upper chuck 140 and the lower wafer W2 held by the lower chuck 141 is performed (process S110). In this position adjustment, the alignment marks W1a, W1b and W1c (see FIG. 9A to FIG. 9C) previously formed on the bonding surface W1j of the upper wafer W1 and the alignment marks W2a, W2b and W2c previously formed on the bonding surface W2j of the lower wafer W2 (see FIG. 9A to FIG. 9C) are used.

Figure 9A:
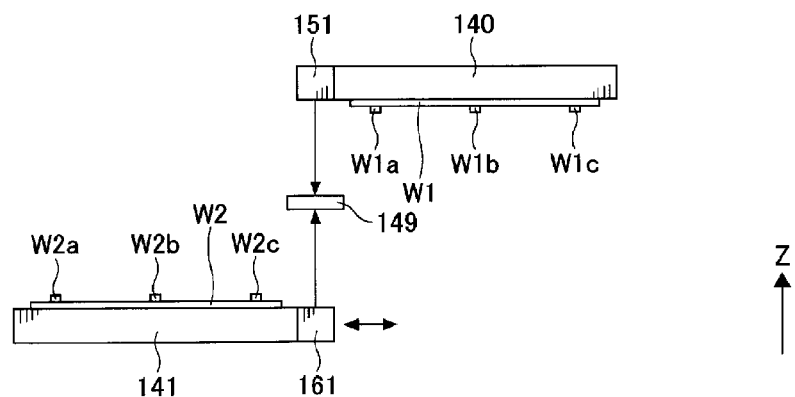
FIG. 9A to FIG. 9C are explanatory diagrams illustrating operations through which horizontal positions of the upper wafer and the lower wafer are adjusted according to the exemplary embodiment.
Figure 9B:
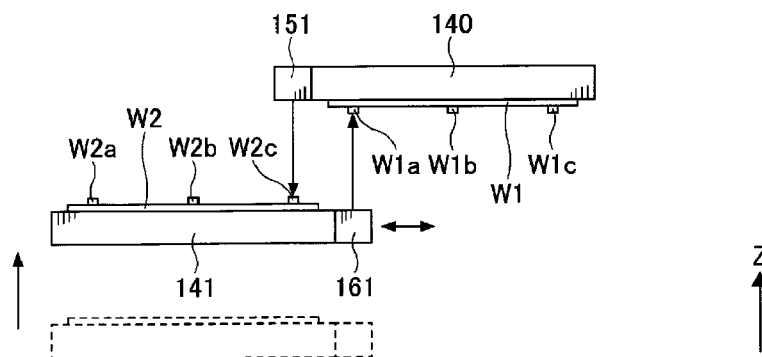
Figure 9C:
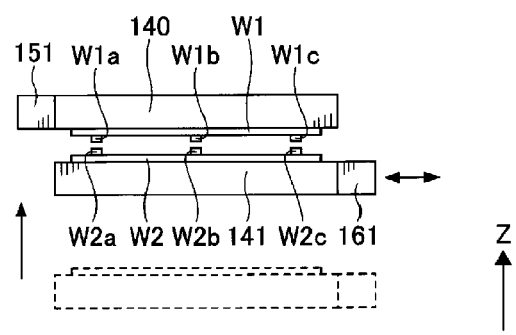

An operation of the position adjustment of the upper wafer W1 and the lower wafer W2 in the horizontal direction will be elaborated with reference to FIG. 9A to FIG. 9C. FIG. 9A is a diagram for describing an operation of performing the position adjustment between the upper imaging device and the lower imaging device according to the present exemplary embodiment. FIG. 9B is a diagram for describing an imaging operation through which the upper imaging device images the lower wafer and an imaging operation through which the lower imaging device images the upper wafer according to the present exemplary embodiment. FIG. 9C is a diagram for describing an operation of performing the position adjustment between the upper wafer and the lower wafer according to the present exemplary embodiment.

First, as shown in FIG. 9A, the position adjustment between the upper imaging device 151 and the lower imaging device 161 in the horizontal direction is performed. To elaborate, the lower chuck 141 is moved in the horizontal direction by the position adjuster 166 to allow the lower imaging device 161 to be located under the upper imaging device 151 approximately. Then, a common target 149 is checked by the upper imaging device 151 and the lower imaging device 161, and a position of the lower imaging device 161 in the horizontal direction is finely adjusted so that the positions of the upper imaging device 151 and the lower imaging device 161 in the horizontal direction are coincident.

Then, as depicted in FIG. 9B, the lower chuck 141 is moved in the vertically upward direction by the position adjuster 166. Then, while moving the lower chuck 141 in the horizontal direction by the position adjuster 166, the alignment marks W2c, W2b and W2a on the bonding surface W2j of the lower wafer W2 are imaged in sequence by using the upper imaging device 151. Concurrently, while moving the lower chuck 141 in the horizontal direction, the alignment marks W1a, W1b and W1c on the bonding surface W1j of the upper wafer W1 are imaged in sequence by using the lower imaging device 161. FIG. 9B shows a state in which the alignment marks W2c of the lower wafer W2 is imaged by the upper imaging device 151 and the alignment mark W1a of the upper wafer W1 is imaged by the lower imaging device 161.

The obtained image data are output to the control device 70. Based on the image data obtained by the upper imaging device 151 and the image data obtained by the lower imaging device 161, the control device 70 controls the position adjuster 166 to adjust the position of the lower chuck 141 in the horizontal direction. This horizontal position adjustment is carried out such that the alignment marks W1a, W1b and W1c of the upper wafer W1 and the alignment marks W2a, W2b and W2c of the lower wafer W2 are respectively overlapped, when viewed in the vertical direction. In this way, the horizontal positions of the upper chuck 140 and the lower chuck 141 are adjusted, and the horizontal positions (for example, including positions in the X-axis direction, the Y-axis direction and the θ direction) of the upper wafer W1 and the lower wafer W2 are adjusted.

Thereafter, as indicated by solid lines in FIG. 9C, the position adjustment in the vertical direction between the upper wafer W1 held by the upper chuck 140 and the lower wafer W2 held by the lower chuck 141 is performed (process S111). To elaborate, the position adjuster 166 moves the lower chuck 141 in the vertically upward direction, thus allowing the lower wafer W2 to approach the upper wafer W1. Accordingly, as shown in FIG. 6, a distance S between the bonding surface W2j of the lower wafer W2 and the bonding surface W1j of the upper wafer W1 is adjusted to, e.g., 50 μm to 200 μm.

Subsequently, after releasing the attracting and holding of the central portion of the upper wafer W1 by the upper chuck 140 (process S112), the push pin 191 of the striker 190 is lowered, so that the central portion of the upper wafer W1 is pressed down (process S113), as shown in FIG. 7A. If the central portion of the upper wafer W1 comes into contact with the central portion of the lower wafer W2 and the central portion of the upper wafer W1 and the central portion of the lower wafer W2 are pressed against each other with a preset force, the central portion of the upper wafer W1 and the central portion of the lower wafer W2 which are pressed against each other are begun to be bonded. Then, a bonding wave whereby the upper wafer W1 and the lower wafer W2 are gradually bonded from the central portions toward the peripheral portions thereof is generated.

Here, since the bonding surface W1j of the upper wafer W1 and the bonding surface W2j of the lower wafer W2 are modified in the processes S101 and S106, respectively, a Van der Waals force (intermolecular force) is generated between the bonding surfaces W1j and W2j, so that the bonding surfaces W1j and W2j are bonded. Further, since the bonding surface W1j of the upper wafer W1 and the bonding surface W2j of the lower wafer W2 are hydrophilized in the processes S102 and S107, respectively, hydrophilic groups between the bonding surfaces W1j and W2j are hydrogen-bonded, so that the bonding surfaces W1j and W2j are firmly bonded.

Thereafter, while pressing the central portion of the upper wafer W1 and the central portion of the lower wafer W2 with the push pin 191, the attracting and holding of the entire upper wafer W1 by the upper chuck 140 is released (process S114). Accordingly, as depicted in FIG. 7B, the entire bonding surface W1j of the upper wafer W1 and the entire bonding surface W2j of the lower wafer W2 come into contact with each other, and the upper wafer W1 and the lower wafer W2 are bonded. Thereafter, the push pin 191 is raised up to the upper chuck 140, and the attracting and holding of the lower wafer W2 by the lower chuck 141 is released.

Subsequently, the combined wafer T is transferred to the alignment measuring device 55 in the fourth processing block G4 by the transfer device 61. In the alignment measuring device 55, a relative position deviation between the alignment marks W1a, W1b and W1c formed on the upper wafer W1 and the alignment marks W2a, W2b and W2c formed on the lower wafer W2 are measured (process S115).

Thereafter, the combined wafer T is transferred to the transition device 51 of the third processing block G3 by the transfer device 61, and then is transferred into the cassette C3 by the transfer device 22 of the carry-in/out station 2. Through these processes, the series of operations of the bonding processing are completed.

<Alignment Measurement and Use of Measurement Data>

Figure 10:
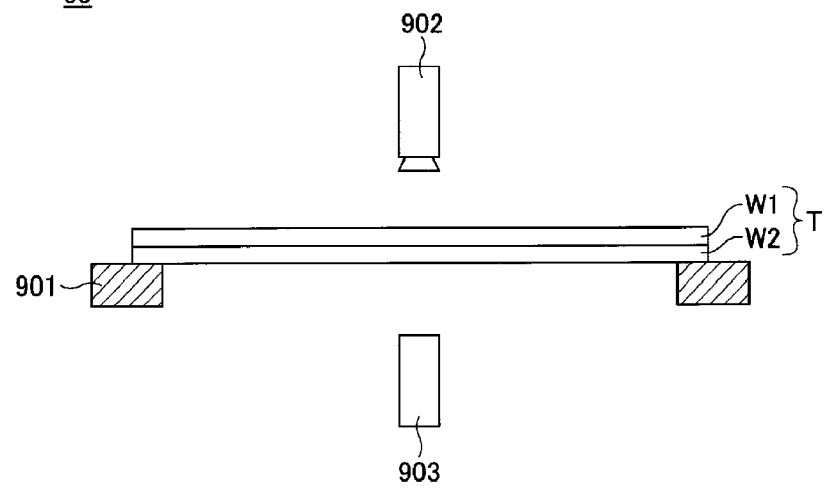
FIG. 10 is a cross sectional view illustrating an alignment measuring device according to the exemplary embodiment.

FIG. 10 is a cross sectional view illustrating the alignment measuring device according to the exemplary embodiment. The alignment measuring device 55 is configured to measure the relative position deviation (hereinafter, simply referred to as "position deviation") between the alignment marks W1a, W1b and W1c (see FIG. 9A to FIG. 9C) formed on the upper wafer W1 and the alignment marks W2a, W2b and W2c (see FIG. 9A to FIG. 9C) formed on the lower wafer W2. In the present specification, the position deviation implies a position deviation when viewed in the vertical direction with respect to the bonding surfaces W1j and W2j of the upper wafer W1 and the lower wafer W2. The alignment measuring device 55 corresponds to a measuring unit described in the claims.

The alignment measuring device 55 is equipped with, for example, a combined wafer holder 901 configured to hold the combined wafer T horizontally; an infrared imaging unit 902 configured to acquire an infrared image of the combined wafer T held by the combined wafer holder 901; and an infrared irradiating unit 903 configured to irradiate infrared ray to a region of the combined wafer T from which the infrared image is obtained.

The infrared imaging unit 902 and the infrared irradiating unit 903 are provided at the opposite sides with the combined wafer holder 901 therebetween. By way of example, the infrared imaging unit 902 is disposed above the combined wafer holder 901, and the infrared irradiating unit 903 is disposed under the combined wafer holder 901.

The infrared imaging unit 902 and the infrared irradiating unit 903 are arranged on the same axis. The infrared ray output from the infrared irradiating unit 903 passes through an opening of the combined wafer holder 901 having a ring shape to be vertically incident upon the combined wafer T held by the combined wafer holder 901. The infrared ray which has penetrated the combined wafer T is received by the infrared imaging unit 902.

Each infrared image obtained by the infrared imaging unit 902 includes at least one alignment mark of the upper wafer W1 and at least one alignment mark of the lower wafer W2. Therefore, the relative position deviation between the alignment mark of the upper wafer W1 and the alignment mark of the lower wafer W2 can be measured on each infrared image.

The alignment measuring device 55 is further equipped with a mover (not shown) configured to move the combined wafer holder 901 in the X-axis direction, the Y-axis direction and the 0 direction. By moving the combined wafer holder 901, the region of the combined wafer T from which the infrared image is obtained can be changed, so that the position deviation can be measured at multiple positions of the combined wafer T.

Further, though the mover moves the combined wafer holder 901 in the present exemplary embodiment, the mover only needs to move the combined wafer holder 901 and the infrared imaging unit 902 relatively. Whether the combined wafer holder 901 is moved or the infrared imaging unit 902 is moved, the region of the combined wafer T from which the infrared image is obtained can be changed, so that the position deviation can be measured at the multiple positions of the combined wafer T.

Figure 11:
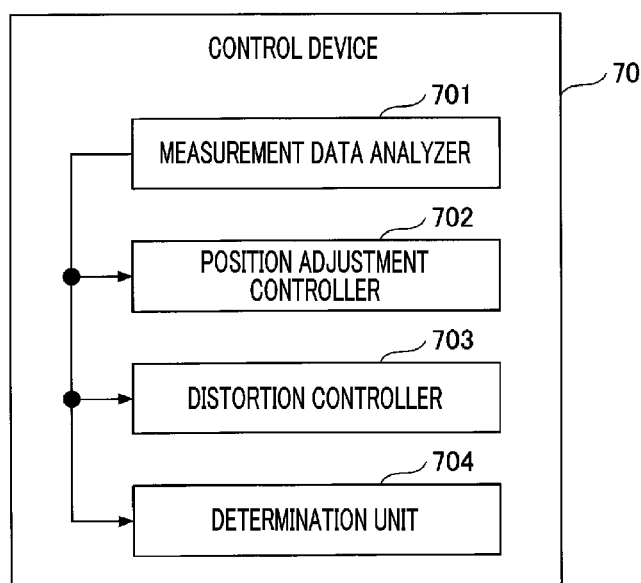
FIG. 11 is a functional block diagram illustrating constituent components of a control device according to the exemplary embodiment.

FIG. 11 is a functional block diagram illustrating constituent components of the control device according to the exemplary embodiment. Individual functional blocks shown in FIG. 11 are conceptual and may not necessarily be physically configured exactly the same as shown in FIG. 11. All or a part of the functional blocks may be functionally or physically dispersed or combined on a unit. All or a part of processing functions performed in the respective functional blocks may be implemented by a program executed by the CPU or implemented by hardware through a wired logic.

As depicted in FIG. 11, the control device 70 includes a measurement data analyzer 701, a position adjustment controller 702, a distortion controller 703, and a determination unit 704. The measurement data analyzer 701 is configured to analyze the measurement data obtained by the alignment measuring device 55. The position adjustment controller 702 is configured to control a position adjustment within a horizontal plane between the upper wafer W1 held by the upper chuck 140 and the lower wafer W2 held by the lower chuck 141 in the currently performed bonding processing based on a position deviation generated in the previously performed bonding processing. The distortion controller 703 is configured to control a distortion of the lower wafer W2 held by the lower chuck 141 in the currently performed bonding processing based on the position deviation generated in the previously performed bonding processing. The determination unit 704 is configured to determine, through a statistical analysis, whether there is a meaningful difference between the position deviation generated in the previously performed bonding processing and the position deviation generated in the currently performed bonding processing. If a statistical value falls out of a preset range, the determination unit 704 makes a determination that there is a meaningful difference. If the statistical value falls within the preset range, the determination unit 704 makes a determination that there is no meaningful difference.

Figure 12A:
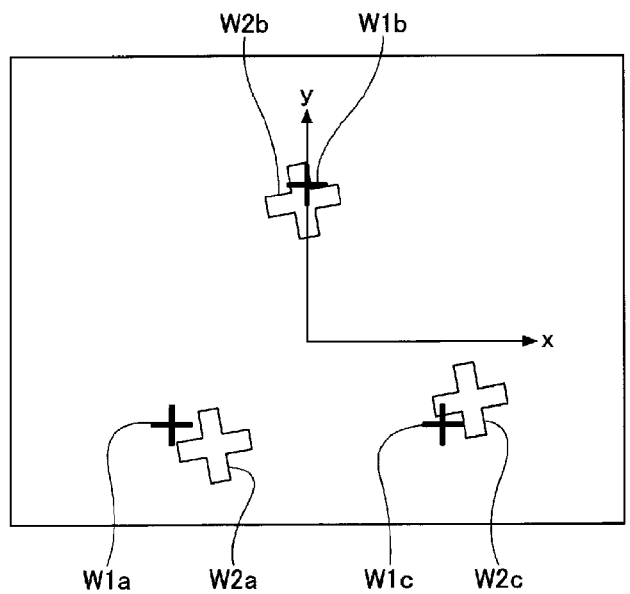
FIG. 12A and FIG. 12B are explanatory diagrams illustrating a processing performed by a measurement data analyzer according to the exemplary embodiment.
Figure 12B:
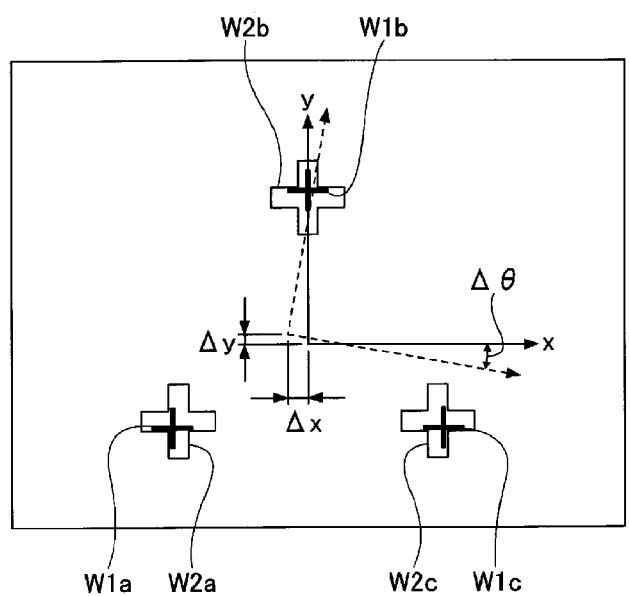

FIG. 12A and FIG. 12B are explanatory diagrams illustrating a processing performed by the measurement data analyzer according to the exemplary embodiment. FIG. 12A is a diagram illustrating the position deviation at multiple positions on an xy coordinate system fixed on the combined wafer according to the exemplary embodiment. In FIG. 12A, the x-axis and the y-axis are orthogonal to each other and parallel to the bonding surface W1j of the upper wafer W1 and the bonding surface W2j of the lower wafer W2. In FIG. 12A, the x-axis fixed to the upper wafer W1 and the x-axis fixed to the lower wafer W2 are overlapped, and the y-axis fixed to the upper wafer W1 and the y-axis fixed to the lower wafer W2 are overlapped. FIG. 12B is an explanatory diagram illustrating the position deviation at each position after parallel translation and rotation are performed to minimize a size and a non-uniformity of the position deviation shown in FIG. 12A. The x-axis and the y-axis indicated by solid lines in FIG. 12B are ones fixed to the upper wafer W1, and the x-axis and the y-axis indicated by dashed lines are ones fixed to the lower wafer W2.

First, the measurement data analyzer 701 first calculates the position deviations at the multiple positions on the xy coordinate system fixed to the combined wafer T, as shown in FIG. 12A. In this calculation, the relative position deviations between the alignment marks W1a, W1b and W1c of the upper wafer W1 and the alignment marks W2a, W2b and W2c of the lower wafer W2 on the images obtained by the infrared imaging unit 902 and horizontal positions (an X-axis position, a Y-axis position and a θ-directional position) of the combined wafer holder 901 with respect to the infrared imaging unit 902 at the moment when the images are obtained are used.

Further, the number of the positions where the position deviation are measured is not limited to three but may be more than three. Furthermore, the shape of each alignment mark for measuring the position deviation is not limited to a cross-shape.

Then, the measurement data analyzer 701 calculates parallel translations Δx and Δy and a rotation Δθ of the lower wafer W2 with respect to the upper wafer W1 to minimize the size and the non-uniformity of the position deviation therebetween, as depicted in FIG. 12B. The parallel translations and the rotation are performed so that a maximum value of the position deviation is reduced or a standard deviation of the position deviation is minimized, for example. Further, the non-uniformity may be represented by a difference between the maximum value and the minimum value of the position deviations instead of the standard deviation.

At this time, the measurement data analyzer 701 calculates a position deviation at each position after the parallel translations and the rotation are performed. The calculation of the optimal parallel translation/rotation and the calculation of the position deviation at each position after the optimal parallel translation/rotation are performed are carried out substantially at the same time.

Further, though the lower wafer W2 is parallel-translated and rotated in the present exemplary embodiment, the lower wafer W2 may be parallel-translated, and the upper wafer W1 may be rotated. Alternatively, the upper wafer W1 may be parallel-translated and rotated.

Figure 13:
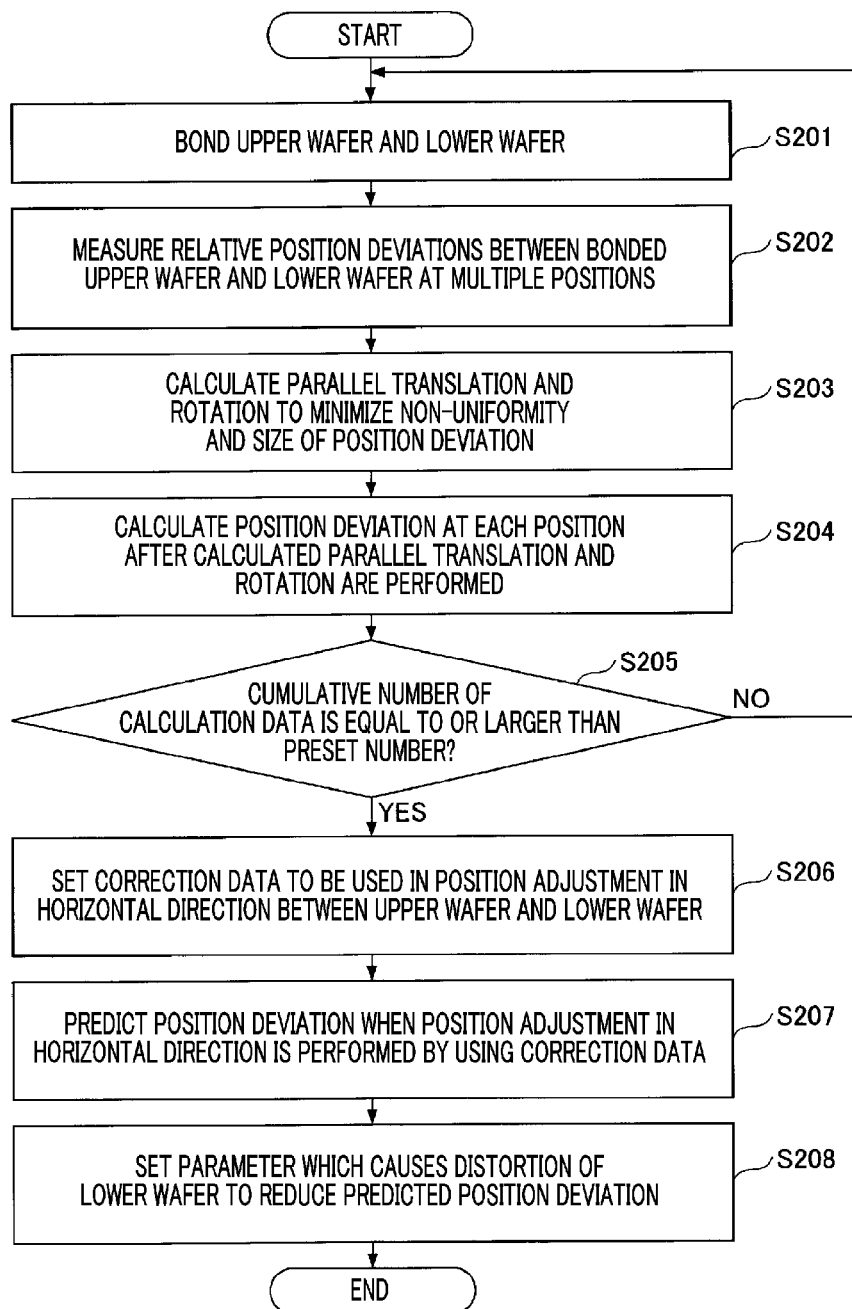
FIG. 13 is a flowchart illustrating a processing of deciding settings of the bonding apparatus based on the measurement data of the alignment measuring device according to the exemplary embodiment.

FIG. 13 is a flowchart illustrating a processing of deciding settings of the bonding apparatus based on the measurement data of the alignment measuring device according to the exemplary embodiment. Processes after a process S201 of FIG. 13 are performed under the control of the control device 70 and carried out in response to, for example, a correction instruction for the position adjustment. The correction instruction for the position adjustment is created when a production condition (including a production lot) of the upper wafer W1 or the lower wafer W2 is changed, for example.

First, the bonding system 1 bonds the upper wafer W1 and the lower wafer W2 by performing the processes S101 to S114 of FIG. 8 (process S201). Then, the alignment measuring device 55 measures the relative position deviation between the upper wafer W1 and the lower wafer W2 at each of the multiple positions, the same as in the process S115 of FIG. 8 (process S202).

Thereafter, the measurement data analyzer 701 calculates the parallel translations Δx and Δy and the rotation Δθ to minimize the non-uniformity and the size of the position deviation (process S203). Further, the measurement data analyzer 701 calculates the position deviation at each position after the parallel translations and rotation calculated in the process S203 are performed (process S204).

Further, the calculation of the parallel translations and the rotation (process S203) and the calculation of the position deviation at each position after the parallel translations and the rotation are performed (process S204) are carried out substantially at the same time.

Afterwards, the measurement data analyzer 701 checks whether the cumulative number of the calculation data is equal to or larger than a preset number (process S205). The calculation data refers to data regarding the parallel translations Δx and Δy and the rotation Δθ and the position deviation at each position after the parallel translations and the rotation are performed. For example, the preset number is set to be equal to or larger than a value (e.g., 20) which allows a distribution of the calculation data to be a normal distribution.

If the cumulative number of the calculation data is less than the preset number (process S205: No), the cumulative number of the calculation data has not reached a sufficient number for statistical analysis, and there is a concern that the non-uniformity in the distribution of the calculation data has been caused by an accidental disturbance. Thus, in this case, the control device 70 returns to the process S201 and repeats the process S201 and the subsequent processes. That is, the processes S201 to S204 are repeated until the number of combined wafers T reaches a preset number.

Meanwhile, if the cumulative number of the calculation data is equal to or larger than the preset number (process S205: Yes), the cumulative number of the calculation data has reached the sufficient number for the statistical analysis. Therefore, the control device 70 proceeds to a process S206 and performs the process S206 and subsequent processes.

In the process S206, by statistically analyzing the calculation data, the measurement data analyzer 701 sets correction data ΔX, ΔY and ΔΘ to be used in the position adjustment in the horizontal direction between the upper wafer W1 and the lower wafer W2 which is performed before the bonding is carried out. As the correction data ΔX, ΔY and ΔΘ, average values of the calculation data Δx, Δy and Δθ may be used, for example.

Further, if the distribution of the calculation data does not become a normal distribution even if the cumulative number of the calculation data has reached the preset number, median values of the calculation data Δx, Δy and Δθ may be used as the correction data ΔX, ΔY and ΔΘ.

Then, the measurement data analyzer 701 predicts a position deviation when the position adjustment in the horizontal direction is performed by using the correction data (process S207). For the purpose, the average values (or the median values) of the calculation data may be used, for example.

Then, the measurement data analyzer 701 sets a parameter which generates a distortion of the lower wafer W2 to reduce the predicted position deviation (process S208). Besides (1) an attracting pressure on the attraction surface 141a of the lower chuck 141 for attracting the lower wafer W2, (2) a temperature of the lower wafer W2 or (3) a shape of the attraction surface 141a of the lower chuck 141 may be used as the parameter which causes the distortion of the lower wafer W2.

(1) If a distribution of the attracting pressure on the attraction surface 141a of the lower chuck 141 is varied, a distribution of a stress applied to the lower wafer W2 is changed, causing a shape of the lower wafer W2 to be changed. Thus, by controlling the distribution of the attracting pressure on the attraction surface 141a of the lower chuck 141, the distortion of the lower wafer W2 can be controlled. The attraction surface 141a of the lower chuck 141 is partitioned into multiple regions, and the attracting pressure is set for each of the multiple regions individually. When the lower wafer W2 is attracted by the attraction surface 141a of the lower chuck 141, the attracting pressure may be generated in the entire attraction surface 141a of the lower chuck 141, or only in a part of the attraction surface 141a of the lower chuck 141. While maintaining the temperature of the lower wafer W2 constant, it is possible to control the distortion of the lower wafer W2.

(2) If the temperature distribution of the lower wafer W2 is changed, the shape of the lower wafer W2 is changed as the lower wafer W2 is locally contracted or expanded. Therefore, by controlling the temperature distribution of the lower wafer W2, the distortion of the lower wafer W2 can be controlled. The control of the temperature distribution of the lower wafer W2 is carried out in the state that the attraction of the lower wafer W2 by the lower chuck 141 is released, for example. Subsequently, the lower chuck 141 attracts the lower wafer W2 in the state that there is generated non-uniformity in the temperature distribution of the lower wafer W2. Then, the shape of the lower wafer W2 is fixed until the attraction of the lower wafer W2 is released again. During a period until the attraction of the lower wafer W2 is released again, the shape of the lower wafer W2, which is made when there is the non-uniformity in the temperature distribution of the lower wafer W2, is maintained even if the temperature distribution of the lower wafer W2 becomes uniform.

(3) If the shape of the attraction surface 141a of the lower chuck 141 is changed after the lower wafer W2 is attracted to the attraction surface 141a of the lower chuck 141, the shape of the lower wafer W2 is changed to follow the change of the attraction surface 141a. Thus, by controlling the shape of the attraction surface 141a of the lower chuck 141, the distortion of the lower wafer W2 can be controlled. The attraction surface 141a of the lower chuck 141 may be transformed between, for example, a flat surface and a curved surface. By way of example, the curved surface has an upwardly protruding dome shape. If the attraction surface 141a of the lower chuck 141 is transformed from the flat surface to the curved surface after the lower wafer W2 is attracted to the attraction surface 141a of the lower chuck 141, the lower wafer W2 is also transformed to have the upwardly protruding dome shape. Accordingly, the lower wafer W2 can be expanded in a diametrical direction, so that the size of the lower wafer W2 and the size of the upper wafer W1 can be made equal. The upper wafer W1 is bent to have a downwardly protruding dome shape by the striker 190 and thus expanded in the diametrical direction.

The distortion of the lower wafer W2 may be controlled by controlling one of the above-described parameters (1) to (3), or by controlling a plurality of the parameters (1) to (3). When controlling the distortion of the lower wafer W2 by using the plurality of the parameters, a combination of the parameters is not particularly limited.

Furthermore, the correction data $\Delta X$, $\Delta Y$ and $\Delta \Theta$ to be used in the position adjustment in the horizontal direction between the upper wafer W1 and the lower wafer W2 performed before the bonding is carried out may be reset based on the setting of the parameter(s) which causes the distortion of the lower wafer W2.

Through the above-described processes, the processing of deciding the settings for use in the bonding apparatus 41 based on the measurement data obtained by the alignment measuring device 55 is completed.

Figure 14:
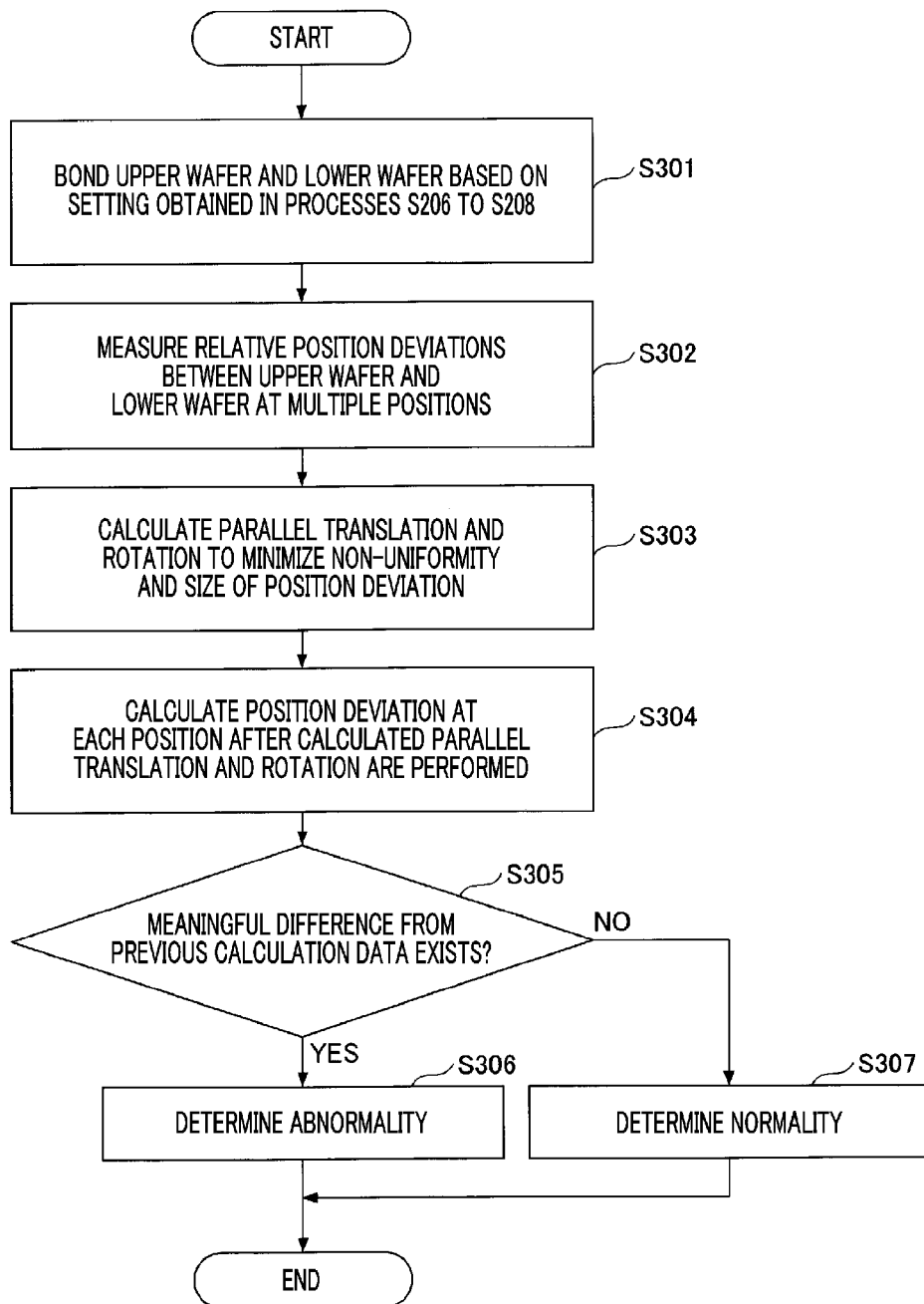
FIG. 14 is a flowchart illustrating an operation of the bonding apparatus based on the measurement data of the alignment measuring device according to the exemplary embodiment.

FIG. 14 is a flowchart illustrating an operation of the bonding apparatus based on the measurement data of the alignment measuring device according to the exemplary embodiment. Processes from a process S301 in FIG. 14 are performed under the control of the control device 70 in response to an instruction for bonding the upper wafer W1 and the lower wafer W2 after the completion of the series of processes shown in FIG. 13, for example.

First, the bonding system 1 bonds the upper wafer W1 and the lower wafer W2 by performing the processes S101 to S114 of FIG. 8 according to the settings obtained in the processes S206 and S208 of FIG. 13 (process S301).

By way of example, the distortion controller 703 performs the attracting and holding of the lower wafer W2 in the process S109 of FIG. 8 based on the setting of the attracting pressure obtained in the process S208 of FIG. 13. Further, besides the attracting pressure, the distortion of the lower wafer W2 may be controlled by using the shape of the attraction surface, the temperature, or the like, as stated above.

Further, the position adjustment controller 702 performs the position adjustment in the horizontal direction in the process S110 of FIG. 8 based on the settings of the correction data $\Delta X$, $\Delta Y$ and $\Delta \Theta$ obtained in the process S206 of FIG. 13. To elaborate, the position adjustment controller 702 carries out the position adjustment in the horizontal direction based on the image data obtained by the upper imaging unit 151, the image data obtained by the lower imaging unit 161 and the correction data. A difference between a position of the lower chuck 141 after the position adjustment in the horizontal direction based on both image data and the correction data and a position of the lower chuck 141 after the position adjustment in the horizontal direction based on only both image data is the same as, for example, the correction data. Furthermore, though the position adjustment in the horizontal direction is carried out by moving the lower chuck 141 in the present exemplary embodiment, it can be achieved by moving the upper chuck 140 instead or by moving both the upper chuck 140 and the lower chuck 141, as mentioned above.

Subsequently, the alignment measuring device 55 measures the relative position deviation between the upper wafer W1 and the lower wafer W2 at multiple positions, the same as in the process S202 of FIG. 13 (process S302).

Then, the measurement data analyzer 701 calculates the parallel translations $\Delta x$ and $\Delta y$ and the rotation $\Delta \theta$ to minimize the size and the non-uniformity of the position deviation therebetween, the same as in the process S203 of FIG. 13 (process S303). Further, the measurement data analyzer 701 calculates a position deviation at each position after the parallel translations and the rotation calculated in the process S303 are performed (process S304).

Further, the calculation of the parallel translations and the rotation (process S303) and the calculation of the position deviation at each position after the parallel translations and the rotation are performed are carried out substantially at the same time.

Afterwards, the determination unit 704 determines, through the statistical analysis, whether there is the meaningful difference between the position deviation generated in the previously performed bonding processing and the position deviation generated in the currently performed bonding processing (process S305). It may be determined through the statistical analysis whether there is a meaningful difference between a position deviation generated in the previously performed bonding processings and a position deviation generated in the most recent bonding processings (including the current one). For the statistical analysis, t-test (student's t-test) or F-test may be used, for example.

In this determination, the parallel translations $\Delta x$ and $\Delta y$ and the rotation $\Delta \theta$ calculated in the process S203 of FIG. 13 and at least one selected from the position deviation at the individual positions calculated in the process S204 of FIG.

13 may be used as the position deviation generated in the previously performed bonding processing, for example. Either Δx or Δy may be used.

Furthermore, in this determination, the parallel translations Δx and Δy and the rotation Δθ calculated in the process S303 of FIG. 14 and at least one selected from the position deviation at the individual positions calculated in the process S304 of FIG. 14 may be used as the position deviation generated in the currently performed bonding processing, for example. Either Δx or Δy may be used.

If there is the meaningful difference between the position deviation generated in the previously performed bonding processing and the position deviation generated in the currently performed bonding processing (process S305; Yes), a quality of the combined wafer T may fall out of a tolerance range, and there is a likelihood that a problem such as an attraction failure may be generated. Thus, in such a case, the determination unit 704 makes a determination that there is abnormality (process S306), and the current processing is ended.

Further, if the determination unit 704 makes the determination of the abnormality, the control device 70 may notify an alarm to a user of the bonding system 1. The alarm is outputted in the form of an image, a sound or a buzzer. After the user repairs the bonding system 1, the processing from the process S301 is resumed. As stated, by stopping the bonding processing when there is a problem such as the attraction failure, production of defective products, which is a waste, can be suppressed.

Meanwhile, if there is no meaningful difference between the position deviation generated in the previously performed bonding processing and the position deviation generated in the currently performed bonding processing (process S305; No), the quality of the combined wafer T falls within the tolerance range. In such a case, the determination unit 704 makes a determination of normality (process S307), and the current processing is ended.

As stated above, according to the present exemplary embodiment, the position adjustment in the horizontal direction in the currently performed bonding processing is controlled based on the position deviation between the alignment marks generated in the previously performed bonding processing. Thus, the position deviation between the alignment marks, which is not solved in the position adjustment in the horizontal direction performed based on only the image data of the upper imaging unit 151 or the lower imaging unit 161, can be reduced.

Moreover, according to the present exemplary embodiment, the distortion of the lower wafer W2 in the currently performed bonding processing is controlled based on the position deviation between the alignment marks generated in the previously performed bonding processing. Accordingly, the position deviation between the alignment marks, which is not solved in the relative parallel translations or rotation between the upper wafer W1 and the lower wafer W2, can be reduced.

In addition, according to the present exemplary embodiment, it is determined through the statistical analysis whether there is the meaningful difference between the position deviation between the alignment marks generated in the previously performed bonding processing and the position deviation between the alignment marks generated in the currently performed bonding processing. Accordingly, it is possible to determine whether the quality of the combined wafer T falls out of the tolerance range, and it can be determined whether a problem such as the attraction failure has occurred. In case that the problem such as the attraction failure is generated, by stopping the bonding processing, the production of defective products, which is a waste, can be suppressed.

<Control Over Distortion of Lower Wafer>

Figure 15:
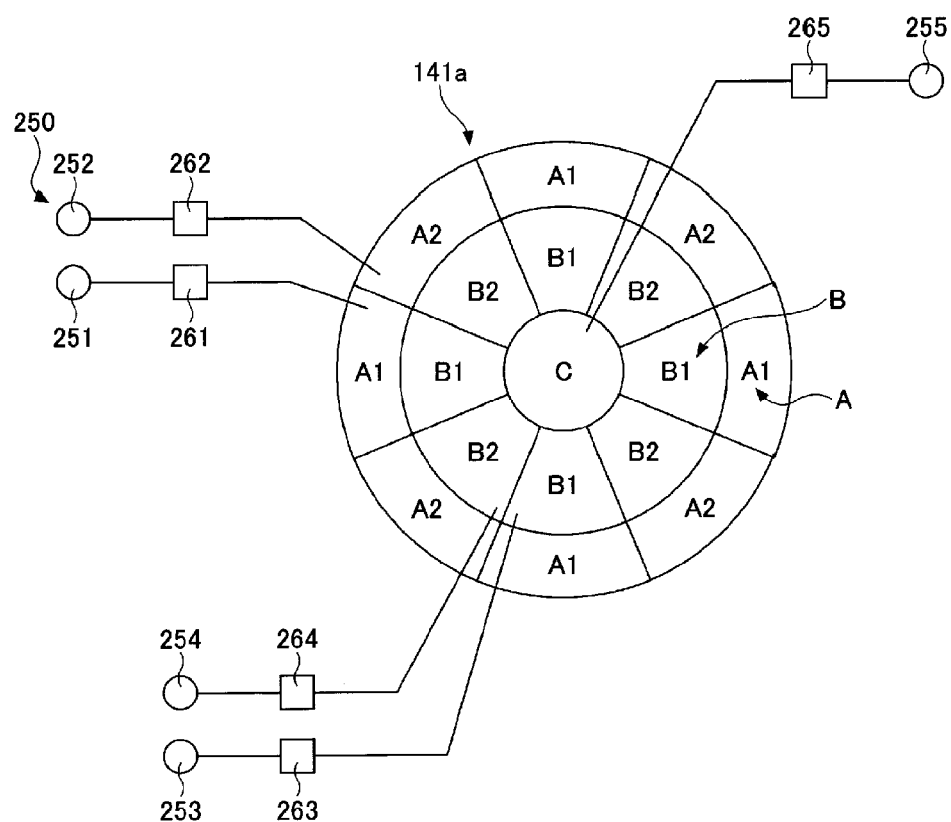
FIG. 15 is a plan view illustrating an attraction surface of the lower chuck according to the exemplary embodiment.

FIG. 15 is a diagram illustrating the attraction surface of the lower chuck according to the exemplary embodiment. The lower chuck 141 shown in FIG. 15 has, on the attraction surface 141a configured to attract the lower wafer W2, multiple regions (for example, circular arc regions A1, circular arc regions A2, circular arc regions B1, circular arc regions B2 and a circular region C) in which the attracting pressure (for example, a vacuum pressure) for attracting the lower wafer W2 is controlled independently. The circular arc regions A1 and A2 are arranged alternately in a circumferential direction, forming a ring region A. Inside this ring region A in a diametrical direction, the circular arc regions B1 and B2 are arranged alternately in the circumferential direction, forming a ring region B. Inside this ring region B, the circular region C is formed. That is, the attraction surface 141a is divided into the ring region A, the ring region B and the circular region C as it goes inwards in the diametrical direction. The ring region A is divided into multiple circular arc regions A1 and A2 in the circumferential direction. Likewise, the ring region B is divided into multiple circular arc regions B1 and B2 in the circumferential direction.

One vacuum pump 251 is connected to the multiple circular arc regions A1 via pipelines which are equipped with one electro-pneumatic regulator 261 (in FIG. 15, only a pipeline connected to the single circular arc region A1 is illustrated). Likewise, one vacuum pump 252 is connected to the multiple circular arc regions A2 via pipelines which are equipped with one electro-pneumatic regulator 262 (in FIG. 15, only a pipeline connected to the single circular arc region A2 is illustrated). Further, one vacuum pump 253 is connected to the multiple circular arc regions B1 via pipelines which are equipped with one electro-pneumatic regulator 263 (in FIG. 15, only a pipeline connected to the single circular arc region B1 is illustrated). Likewise, one vacuum pump 254 is connected to the multiple arc regions B2 via pipelines which are equipped with one electro-pneumatic regulator 264 (in FIG. 15, only a pipeline connected to the single circular arc region B2 is illustrated). Furthermore, one vacuum pump 255 is connected to the single circular region C via a pipeline which is equipped with one electro-pneumatic regulator 265.

If the control device 70 operates the vacuum pump 251, the vacuum pump 251 generates the vacuum pressure in each of the circular arc regions A1. This vacuum pressure is maintained at a predetermined set value by the electro-pneumatic regulator 261, so that an attracting pressure corresponding to this set value is generated in each of the circular arc regions A1. If the control device 70 stops the operation of the vacuum pump 251, each circular arc region A1 is turned back into an atmospheric pressure, so that the generation of the attracting pressure in each circular arc region A1 is stopped. Since the generation and the release of the attracting pressure in the other circular arc regions A2, B1 and B2 and in the circular region C are the same as the generation and the release of the attracting pressure in the circular arc regions A1, redundant description thereof will be omitted here.

The vacuum pumps 251 to 255, the electro-pneumatic regulators 261 to 265, and so forth constitute an attracting pressure distribution adjuster 250. The attracting pressure distribution adjuster 250 is configured to adjust a distribution of the attracting pressure of the lower chuck 141 configured to attract the lower wafer W2, thus generating the distortion of the lower wafer W2. The distribution of the attracting pressure can be varied by selecting operating target vacuum pumps from the vacuum pumps 251 to 255 or by changing the set values for the electro-pneumatic regulators 261 to 265. This changing of the settings is performed by the distortion controller 703. Further, the layout of the regions in which the attracting pressures are controlled independently is not limited to the example shown in FIG. 15.

Further, though the lower chuck 141 is configured to vacuum-attract the lower wafer W2 in the present exemplary embodiment, the lower chuck 141 may be configured to attract the lower wafer W2 electrostatically. In this case, the attracting pressure distribution adjuster 250 includes multiple internal electrodes embedded in the lower chuck 141; a power supply configured to supply a power to the internal electrodes; and so forth. The power supply may be a step-down DC/DC converter, a step-up DC/DC converter, or the like. The distribution of the attracting pressure can be varied by altering, among the multiple internal electrodes, the internal electrode which supplies the power, by changing the power to be fed, and so forth.

Figure 16:
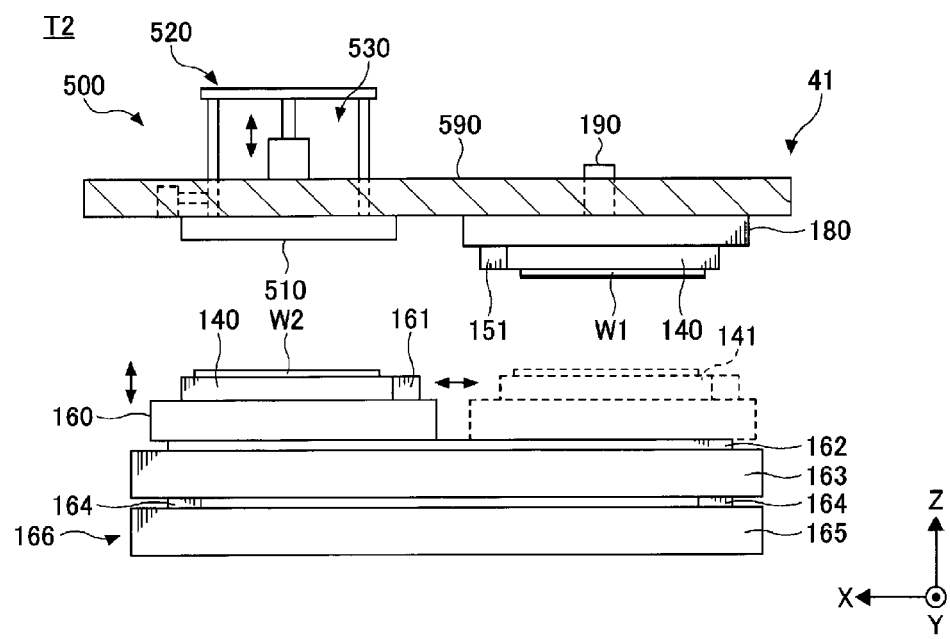
FIG. 16 is a side view illustrating the upper chuck, the lower chuck and a temperature distribution adjuster according to the exemplary embodiment.

FIG. 16 is a side view illustrating the upper chuck, the lower chuck and a temperature distribution adjuster according to the exemplary embodiment. The upper chuck 140 and a temperature distribution adjuster 500 are fixed to a common horizontal frame 590, and the lower chuck 141 is disposed below the upper chuck 140 and the temperature distribution adjuster 500.

The temperature distribution adjuster 500 causes the distortion of the lower wafer W2 by adjusting the temperature distribution of the lower wafer W2 held by the lower chuck 141. The temperature distribution adjuster 500 includes a main body 510 having a bottom surface of a diameter larger than a diameter of the lower wafer W2; a supporting member 520 configured to support the main body 510 from above it; and an elevating unit 530 configured to move the supporting member 520 in the vertical direction.

The main body 510 is configured to be movable up and down under the horizontal frame 590. The elevating unit 530 is fixed to the horizontal frame 590 and configured to move the main body 510 up and down with respect to the horizontal frame 590. Accordingly, a distance between the main body 510 and the lower chuck 141 can be adjusted.

Figure 17:
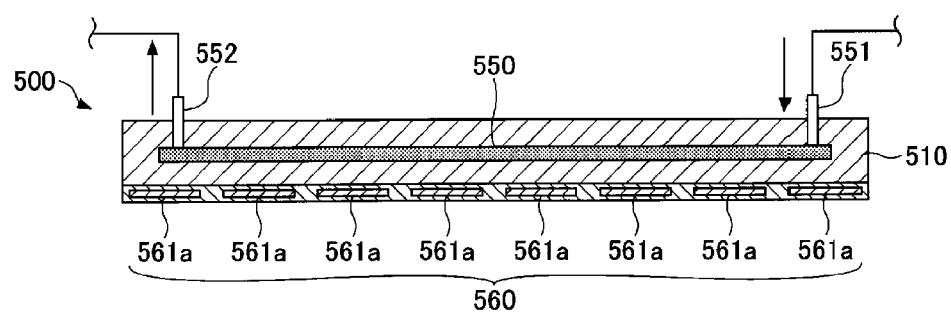
FIG. 17 is a side cross sectional view illustrating a main body of the temperature distribution adjuster according to the exemplary embodiment.

FIG. 17 is a side cross sectional view illustrating the main body of the temperature distribution adjuster according to the exemplary embodiment. The main body 510 includes, as depicted in FIG. 17, a cooling unit 550 and a heating unit 560.

The cooling unit 550 is, for example, a flow path formed within the main body 510 and is connected to an inlet line 551 through which a coolant such as cooling water is introduced into the cooling unit 550 and an outlet line 552 through which the coolant is flown out from the cooling unit 550. By circulating the temperature-controlled coolant in this cooling unit 550, the entire surface of the lower wafer W2 can be cooled in a uniform manner.

Meanwhile, the heating unit 560 is configured to heat the lower wafer W2 locally. To elaborate, the heating unit 560 includes multiple independent heating regions 561a, and by heating these heating regions 561a selectively, a part of or the entire of the lower wafer W2 can be heated. The selection of the heating regions 561a is carried out by the distortion controller 703.

According to the present exemplary embodiment, the local heating of the lower wafer W2 by the heating unit 560 and the temperature adjustment of the lower wafer W2 by the cooling unit 550 can be performed at the same time. Further, though the local heating of the lower wafer W2 is performed in the present exemplary embodiment, the local cooling of the lower wafer W2 may be performed. Any of various heating or cooling methods can be adopted as long as the non-uniform temperature distribution of the lower wafer W2 can be created.

By way of example, the adjustment of the temperature distribution of the lower wafer W2 is performed in the state that the attraction of the lower wafer W2 by the lower chuck 141 is released. Then, in the state that there is created the non-uniformity in the temperature distribution of the lower wafer W2, the lower wafer W2 is attracted by the lower chuck 141. Thereafter, the bonding between the lower wafer W2 and the upper wafer W1 is performed, and the shape of the lower wafer W2 is fixed until the attraction of the lower wafer W2 is released again.

Figure 18A:
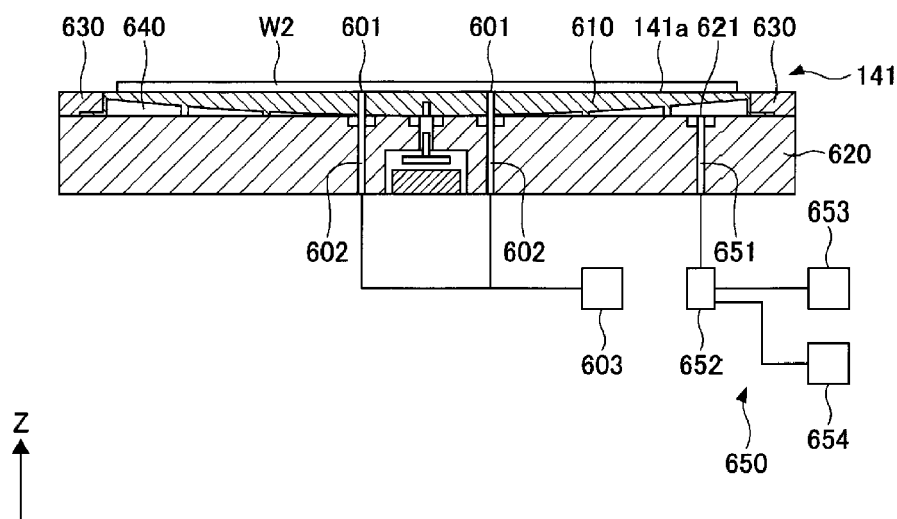
FIG. 18A and FIG. 18B are side cross sectional views illustrating a lower chuck according to a modification example.
Figure 18B:
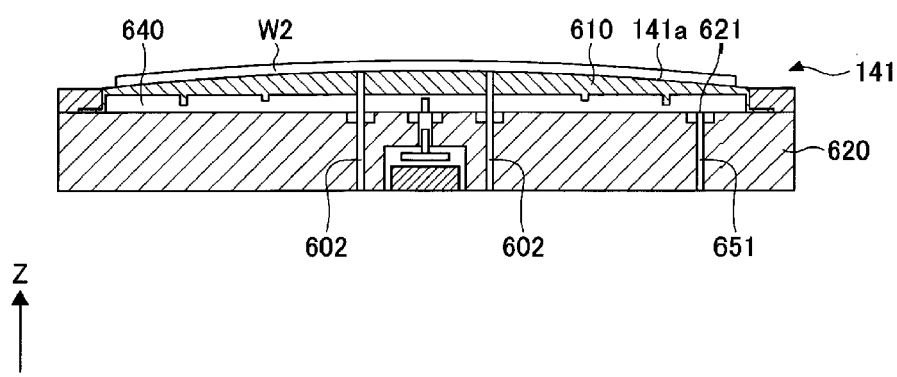

FIG. 18A and FIG. 18B are side cross sectional views illustrating a lower chuck according to a modification example. FIG. 18A illustrates a state when an attraction surface 141a of a lower chuck 141 is a flat surface, and FIG. 18B illustrates a state when the attraction surface 141a of the lower chuck 141 is an upwardly protruding dome-shaped curved surface. The lower chuck 141 according to the present modification example includes an elastic transformation member 610 having the attraction surface 141a configured to attract the lower wafer W2; and a base member 620 configured to support the elastic transformation member 610.

The elastic transformation member 610 has suction grooves 601 on the attraction surface 141a which attracts the lower wafer W2. A layout of the suction grooves 601 may be selected as required. The suction grooves 601 are connected to a vacuum pump 603 via suction lines 602. If the vacuum pump 603 is operated, the lower wafer W2 is vacuum-attracted to a top surface of the elastic transformation member 610. Meanwhile, if the operation of the vacuum pump 603 is stopped, the vacuum-attraction of the lower wafer W2 is released.

The elastic transformation member 610 is formed of alumina ceramic or a ceramic material such as, but not limited to, SiC. Further, the base member 620 is also formed of alumina ceramic or a ceramic material such as, but not limited to, SiC, the same as the elastic transformation member 610.

The base member 620 is disposed under the elastic transformation member 610, and a fixing ring 630 is provided around the elastic transformation member 610. A peripheral portion of the elastic transformation member 610 is fixed to the base member 620 by the fixing ring 630.

A sealed pressure-variable space 640 is formed between a bottom surface of the elastic transformation member 610 and a top surface of the base member 620. An attraction surface transforming unit 650 is configured to adjust a shape of the attraction surface 141a of the elastic transformation member 610 by adjusting an air pressure within the pressure-variable space 640.

The attraction surface transforming unit 650 has an air feed/exhaust line 651, and the air feed/exhaust line 651 is connected to an air feed/exhaust opening 621 formed at a top surface of the base member 620. An electro-pneumatic regulator 653 configured to supply air into the pressure-variable space 640 and a vacuum pump 654 configured to exhaust the air from the pressure-variable space 640 are connected to the air feed/exhaust line 651 via a switching valve 652. The switching valve 652 is switched into between a state (A) and a state (B): (A) a flow path connecting the switching valve 652 and the vacuum pump 654 is opened for the air feed/exhaust opening 621, and a flow path connecting the switching valve 652 and the electro-pneumatic regulator 653 is closed for the air feed/exhaust opening 621; and (B) the flow path connecting the switching valve 652 and the vacuum pump 654 is closed for the air feed/exhaust opening 621, and the flow path connecting the switching valve 652 and the electro-pneumatic regulator 653 is opened for the air feed/exhaust opening 621.

As depicted in FIG. 18A, if the inside of the pressure-variable space 640 is decompressed (for example, −10 kPa) by being evacuated through the vacuum pump 654, the elastic transformation member 610 is attracted to the base member 620. In this state, the top surface of the elastic transformation member 610 becomes the flat surface.

Meanwhile, as shown in FIG. 18B, if the inside of the pressure-variable space 640 is pressurized (for example, 0 kPa to 100 kPa) by supplying the air thereinto through the electro-pneumatic regulator 653, the elastic transformation member 610 is pressed from below it. Since the peripheral portion of the elastic transformation member 610 is fixed to the base member 620 by the fixing ring 630, a central portion of the elastic transformation member 610 is protruded higher than the peripheral portion thereof, and the top surface of the elastic transformation member 610 becomes the curved surface. This curved surface is of an upwardly protruding dome shape. A radius of curvature of this curved surface can be controlled by adjusting the air pressure within the pressure-variable space 640. Changing of the setting of the air pressure within the pressure-variable space 640 is carried out by the distortion controller 703.

If the shape of the attraction surface 141a of the lower chuck 141 is changed after the lower wafer W2 is attracted to the attraction surface 141a of the lower chuck 141, the shape of the lower wafer W2 is changed to conform to the attraction surface 141a. Thus, by changing the shape of the attraction surface 141a of the lower chuck 141, the distortion of the lower wafer W2 can be controlled.

<Modifications and Improvements>

So far, the exemplary embodiment of the bonding system and the bonding method have been described. However, the present disclosure is not limited to the above-described exemplary embodiment or the like. Various changes, corrections, replacements, addition, deletion and combinations may be made within the scope of the claims, and all of these are included in the scope of the inventive concept of the present disclosure.

In the above-described exemplary embodiment and modification example, the attracting pressure distribution adjuster 250, the temperature distribution adjuster 500 or the attracting surface transforming unit 650 is used as a distortion generator. Under the control of the distortion controller 703, the distortion generator is configured to generate the distortion of the lower wafer W2 attracted to the lower chuck 141. The attracting pressure distribution adjuster 250, the temperature distribution adjuster 500 and the attraction surface transforming unit 650 may be used individually or in combinations. Here, the combinations are not particularly limited.

The distortion controller 703 according to the above-described exemplary embodiment and modification example controls the distortion of the lower wafer W2 attracted to the lower chuck 141. However, the distortion controller 703 may control the distortion of the upper wafer W1 attracted to the upper chuck 140. That is, though the upper wafer W1, the upper chuck 140, the lower wafer W2 and the lower chuck 141 correspond to the first substrate, the first holder, the second substrate and the second holder, respectively, in the above-described exemplary embodiment and modified example, the upper wafer W1, the upper chuck 140, the lower wafer W2 and the lower cuck 141 may correspond to the second substrate, the second holder, the first substrate and the first holder, respectively. Furthermore, the distortion controller 703 may control both the distortion of the lower wafer W2 and the distortion of the upper wafer W1.

This application claims the benefit of Japanese Patent Application No. 2018-008892 filed on Jan. 23, 2018, the entire disclosures of which are incorporated herein by reference.

According to the exemplary embodiments, it is possible to improve accuracy of position adjustment between a substrate at an upper side and a substrate at a lower side in the horizontal direction, which is performed before bonding of the two substrates is carried out.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

I claim:

1. A bonding system, comprising:
a first holder and a second holder arranged to be spaced apart from each other in a vertical direction, the first holder having, on a surface thereof facing the second holder, an attraction surface configured to attract and hold a first substrate, and the second holder having, on a surface thereof facing the first holder, an attraction surface configured to attract and hold a second substrate;
a position adjuster configured to move the first holder and the second holder relatively to perform a position adjustment in a horizontal direction between the first substrate held by the first holder and the second substrate held by the second holder;
a pressing unit configured to press the first substrate held by the first holder and the second substrate held by the second holder against each other;
a position adjustment controller configured to receive, after the first substrate and the second substrate are pressed against each other by the pressing unit and a bonding of the first substrate and the second substrate is completed, measurement data obtained by measuring a position deviation between an alignment mark formed on the first substrate and an alignment mark formed on the second substrate in a state upon the completion of the bonding from a measuring unit positioned outside the bonding system, and configured to control the position adjustment in the horizontal direction in a currently-performed bonding processing based on the position deviation generated in a previously-performed bonding processing;
a distortion generator configured to generate a distortion of the second substrate held by the second holder; and
a distortion controller configured to control the distortion in the currently-performed bonding processing based on the position deviation generated in the previously-performed bonding processing.

2. The bonding system of claim 1, wherein the distortion generator comprises an attracting pressure distribution adjuster configured to generate the distortion of the second substrate by adjusting a distribution of an attracting pressure of the second holder configured to attract the second substrate.

3. The bonding system of claim 2,
wherein the distortion generator comprises a temperature distribution adjuster configured to generate the distortion of the second substrate by adjusting a temperature distribution of the second substrate.

4. The bonding system of claim 3,
wherein the distortion generator comprises an attraction surface transforming unit configured to generate, by transforming the attraction surface of the second holder configured to attract the second substrate, the distortion of the second substrate previously attracted to the attraction surface.

5. The bonding system of claim 4, further comprising:
a determination unit configured to determine, through a statistical analysis, whether there is a meaningful difference between the position deviation generated in the previously-performed bonding processing and the position deviation generated in the currently-performed bonding processing.

6. A bonding system, comprising:
a first holder and a second holder arranged to be spaced apart from each other in a vertical direction, the first holder having, on a surface thereof facing the second holder, an attraction surface configured to attract and hold a first substrate, and the second holder having, on a surface thereof facing the first holder, an attraction surface configured to attract and hold a second substrate;
a position adjuster configured to move the first holder and the second holder relatively to perform a position adjustment in a horizontal direction between the first substrate held by the first holder and the second substrate held by the second holder;
a pressing unit configured to press the first substrate held by the first holder and the second substrate held by the second holder against each other;
a position adjustment controller configured to receive, after the first substrate and the second substrate are pressed against each other by the pressing unit and a bonding of the first substrate and the second substrate is completed, measurement data obtained by measuring a position deviation between an alignment mark formed on the first substrate and an alignment mark formed on the second substrate in a state upon the completion of the bonding from a measuring unit positioned outside the bonding system, and configured to control the position adjustment in the horizontal direction in a currently-performed bonding processing based on the position deviation generated in a previously-performed bonding processing;
a determination unit configured to determine, through a statistical analysis, whether there is a meaningful difference between the position deviation generated in the previously-performed bonding processing and the position deviation generated in the currently-performed bonding processing.

7. The bonding system of claim 1,
wherein if a cumulative number of a calculation data of the position deviation generated in the previously-performed bonding processing is equal to or larger than a preset number, the position adjustment controller is configured to control the position adjustment in the horizontal direction in the currently-performed bonding processing based on the cumulated calculation data, and
if the cumulative number is less than the preset number, the position adjustment controller is configured not to control the position adjustment in the horizontal direction in the currently-performed bonding processing based on the cumulated calculation data.

8. The bonding system of claim 1,
wherein the distortion generator comprises a temperature distribution adjuster configured to generate the distortion of the second substrate by adjusting a temperature distribution of the second substrate.

9. The bonding system of claim 1,
wherein the distortion generator comprises an attraction surface transforming unit configured to generate, by transforming the attraction surface of the second holder configured to attract the second substrate, the distortion of the second substrate previously attracted to the attraction surface.

10. The bonding system of claim 2,
wherein the distortion generator comprises an attraction surface transforming unit configured to generate, by transforming the attraction surface of the second holder configured to attract the second substrate, the distortion of the second substrate previously attracted to the attraction surface.

11. The bonding system of claim 8,
wherein the distortion generator comprises an attraction surface transforming unit configured to generate, by transforming the attraction surface of the second holder configured to attract the second substrate, the distortion of the second substrate previously attracted to the attraction surface.

12. The bonding system of claim 1, further comprising:
a determination unit configured to determine, through a statistical analysis, whether there is a meaningful difference between the position deviation generated in the previously-performed bonding processing and the position deviation generated in the currently-performed bonding processing.

13. The bonding system of claim 2, further comprising:
a determination unit configured to determine, through a statistical analysis, whether there is a meaningful difference between the position deviation generated in the previously-performed bonding processing and the position deviation generated in the currently-performed bonding processing.

14. The bonding system of claim 3, further comprising:
a determination unit configured to determine, through a statistical analysis, whether there is a meaningful difference between the position deviation generated in the previously-performed bonding processing and the position deviation generated in the currently-performed bonding processing.

15. The bonding system of claim 8, further comprising:
a determination unit configured to determine, through a statistical analysis, whether there is a meaningful difference between the position deviation generated in the previously-performed bonding processing and the position deviation generated in the currently-performed bonding processing.

16. The bonding system of claim 9, further comprising:
a determination unit configured to determine, through a statistical analysis, whether there is a meaningful difference between the position deviation generated in the previously-performed bonding processing and the position deviation generated in the currently-performed bonding processing.

17. The bonding system of claim 2, wherein if a cumulative number of a calculation data of the position deviation generated in the previously-performed bonding processing is equal to or larger than a preset number, the position adjustment controller is configured to control the position adjustment in the horizontal direction in the currently-performed bonding processing based on the cumulated calculation data, and if the cumulative number is less than the preset number, the position adjustment controller is configured not to control the position adjustment in the horizontal direction in the currently-performed bonding processing based on the cumulated calculation data.

18. The bonding system of claim 6, wherein if a cumulative number of a calculation data of the position deviation generated in the previously-performed bonding processing is equal to or larger than a preset number, the position adjustment controller is configured to control the position adjustment in the horizontal direction in the currently-performed bonding processing based on the cumulated calculation data, and if the cumulative number is less than the preset number, the position adjustment controller is configured not to control the position adjustment in the horizontal direction in the currently-performed bonding processing based on the cumulated calculation data.

19. The bonding system of claim 8, wherein if a cumulative number of a calculation data of the position deviation generated in the previously-performed bonding processing is equal to or larger than a preset number, the position adjustment controller is configured to control the position adjustment in the horizontal direction in the currently-performed bonding processing based on the cumulated calculation data, and if the cumulative number is less than the preset number, the position adjustment controller is configured not to control the position adjustment in the horizontal direction in the currently-performed bonding processing based on the cumulated calculation data.

20. The bonding system of claim 9, wherein if a cumulative number of a calculation data of the position deviation generated in the previously-performed bonding processing is equal to or larger than a preset number, the position adjustment controller is configured to control the position adjustment in the horizontal direction in the currently-performed bonding processing based on the cumulated calculation data, and if the cumulative number is less than the preset number, the position adjustment controller is configured not to control the position adjustment in the horizontal direction in the currently-performed bonding processing based on the cumulated calculation data.

\* \* \* \* \*

UNITED STATES PATENT AND TRADEMARK OFFICE
CERTIFICATE OF CORRECTION

PATENT NO. : 12,198,963 B2
APPLICATION NO. : 18/480745
DATED : January 14, 2025
INVENTOR(S) : Yoshitaka Otsuka It is certified that error appears in the above-identified patent and that said Letters Patent is hereby corrected as shown below:

In the Specification

Column 9, Line 37, "Win" should be -- W1n --.

Column 10, Line 37, "Wij" should be -- W1j --.

Column 10, Line 43, "Win" should be -- W1n --.

Signed and Sealed this
Twenty-second Day of April, 2025

Coke Morgan Stewart
*Acting Director of the United States Patent and Trademark Office*